US007045824B2

(12) United States Patent
Malone et al.

(10) Patent No.: US 7,045,824 B2
(45) Date of Patent: May 16, 2006

(54) HIGH SPEED OPTICAL SUBASSEMBLY WITH CERAMIC CARRIER

(75) Inventors: Kevin Malone, Boulder, CO (US); Christine Mollenkopf, Superior, CO (US); Jason Yorks, Longmont, CO (US); Lance Thompson, Broomfield, CO (US); Blake Mynatt, Broomfield, CO (US); Mark Stiehl, Lafayette, CO (US); Tess Abidi, Westminster, CO (US); William Kit Dean, Golden, CO (US); Robert A. Arnold, Broomfield, CO (US); Richard J. Adams, Boulder, CO (US); George W. Jarriel, Jr., Boulder, CO (US); Dale Isaacson, Idaho Springs, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 11/119,961

(22) Filed: May 2, 2005

(65) Prior Publication Data

US 2005/0189549 A1 Sep. 1, 2005

Related U.S. Application Data

(63) Continuation of application No. 09/969,085, filed on Oct. 1, 2001, now Pat. No. 6,888,169.

(60) Provisional application No. 60/304,925, filed on Jul. 11, 2001, provisional application No. 60/237,341, filed on Sep. 29, 2000.

(51) Int. Cl.
*H01L 27/15* (2006.01)
*G02B 6/36* (2006.01)
*H01S 3/08* (2006.01)

(52) U.S. Cl. ........................ 257/82; 257/432; 257/433; 385/92; 372/98

(58) Field of Classification Search ..................... None
See application file for complete search history.

(56) References Cited

U.S. PATENT DOCUMENTS

| | | | | |
|---|---|---|---|---|
| 5,293,511 | A | 3/1994 | Poradish et al. | 257/434 |
| 5,809,050 | A | 9/1998 | Baldwin et al. | 372/43 |
| 5,835,514 | A | 11/1998 | Yuen et al. | 372/36 |
| 5,877,042 | A | 3/1999 | Mattson et al. | 438/123 |
| 5,907,151 | A | 5/1999 | Gramann et al. | 250/214.1 |
| 6,069,905 | A | 5/2000 | Davis et al. | 372/43 |
| 6,335,224 | B1 | 1/2002 | Peterson et al. | 438/114 |
| 6,384,473 | B1 | 5/2002 | Peterson et al. | 257/680 |
| 6,489,670 | B1 | 12/2002 | Peterson et al. | 257/686 |
| 6,495,895 | B1 | 12/2002 | Peterson et al. | 257/434 |
| 6,531,341 | B1 | 3/2003 | Peterson et al. | 438/123 |
| 6,538,312 | B1 | 3/2003 | Peterson et al. | 257/680 |
| 6,567,435 | B1 | 5/2003 | Scott et al. | 372/29.021 |
| 6,588,949 | B1 * | 7/2003 | Zhou | 385/94 |
| 6,661,084 | B1 | 12/2003 | Peterson et al. | 257/680 |
| 6,674,159 | B1 | 1/2004 | Peterson et al. | 257/680 |
| 6,888,169 | B1 | 5/2005 | Malone et al. | 257/82 |
| 6,932,522 | B1 * | 8/2005 | Zhou | 385/94 |

FOREIGN PATENT DOCUMENTS

| | | |
|---|---|---|
| EP | 0309942 | 4/1989 |
| EP | 0500240 | 2/1992 |
| EP | 0713112 | 11/1994 |
| EP | 0975072 | 1/2000 |
| EP | 1022822 | 7/2000 |
| WO | WO 87/02833 | 5/1987 |

OTHER PUBLICATIONS

Rui Pu, et al, "Thermal Resistance of VCSEL's Bonded to Integrated Circuits", IEEE Photonics TEchnology Letters, vol. 11, No. 12, Dec., 1999.

Shimada, "Parallel Optical-Transmission Module Using Vertical-Cavity Surface-Emitting Laser Array . . . ", Jpn. J. Appl. Phys. vol. 40 (200)pp. L114-L116,Part 2, No. 2A, Feb. 1, 2001.

* cited by examiner

*Primary Examiner*—Alonzo Chambliss
(74) *Attorney, Agent, or Firm*—Barlow, Josephs & Holmes, Ltd.

(57) ABSTRACT

A multilayer ceramic carrier for an optical element includes a terraced cavity for retaining a vertically receiving or vertically emitting optical element. The multilayer ceramic carrier includes conductive traces interposed between the ceramic layers and which extend into the terraced cavity along the trenches formed in the cavity. A vertical cavity surface emitting laser or vertically receiving optical element is wire bonded to the conductive traces which extend into the cavity. In one embodiment, the terraced cavity of the multilayer ceramic carrier includes a VCSEL and photodetector therein, the photodetector capable of monitoring the output optical power of the VCSEL. The method for forming the multilayer ceramic carrier includes forming a plurality of layers of ceramic tape, joining the layers, then co-firing the stacked layers. The multilayer ceramic carrier is joined to a plastic optical housing which includes an aperture for securing an optical fiber. The fiber launch direction is generally orthogonal to the optical surface of the vertically emitting or vertically receiving optical element secured within the ceramic carrier. The optical subassembly comprising the plastic optical housing and ceramic carrier is mounted on the surface of a printed circuit board or adjacent the edge of a printed circuit board, such that the light emitted or detected by the optical element, preferably travels along a fiber launch direction parallel to the surface of the printed circuit board. The optical assembly may be joined to the printed circuit board using various connectors capable of carrying an electrical signal.

24 Claims, 28 Drawing Sheets

HIGH SPEED OPTICAL SUBASSEMBLY WITH CERAMIC CARRIER

CROSS-REFERENCE TO RELATED APPLICATIONS

This application claims priority to provisional application Ser. No. 60/237,341 filed Sep. 29, 2000 entitled, "High-Speed Optical Subassembly with Ceramic Carrier", and provisional application Ser. No. 60/304,925 filed Jul. 11, 2001, entitled "Edge Mount, Leaded Ceramic Optical Sub-assembly", the contents of each of which are herein incorporated by reference.

This application is a continuation of non-provisional U.S. application Ser. No. 09/969,085 filed Oct. 1, 2001, now U.S. Pat. No. 6,888,169 issued May 3, 2005.

FIELD OF THE INVENTION

The present invention is related, most generally, to the manufacture and packaging of optical sub-assemblies (OSAs). More particularly, the present invention is related to packaging vertically-emitting optical devices such as vertical cavity surface emitting lasers (VCSELs), and vertically-receiving solid state optical devices such as photodetectors, within OSAs. The present invention also relates to the method and apparatus for mounting the OSA on a printed circuit board or other mounting surface.

BACKGROUND OF THE INVENTION

In today's rapidly-advancing optical electronics industry, vertical cavity surface emitting lasers have become preferred as the optical source. Vertical cavity surface emitting lasers—also referred to as VCSELs—are favored because of the ease of their manufacture, the repeatability of the manufacturing process used to form the VCSELs, the reduced substrate area each VCSEL requires, and because of the superior uniformity of the VCSELs formed within the same substrate. Furthermore, vertical cavity surface emitting lasers typically require less power to drive their lasing action than edge emitting lasers. A principal characteristic of a VCSEL is that it emits beams vertically, i.e. in a direction normal to the P-N junction and the surface of the semiconductor substrate on which it is fabricated. There are at least two issues, however, associated with the use of VCSELs in optoelectronic systems.

One issue is monitoring the optical output of the VCSEL. In conventional edge emitting lasers, one end of the laser serves as the emitting edge, while the opposite end may be used to monitor optical power once the relative amount of light emitted out of the respective ends is determined. A small portion of light is typically emitted out of the end that is not used as a primary optical source. Most commercially available VCSELs emit light normal to the surface in which they are formed. Therefore, in order to monitor optical power, this emitted beam must be monitored. It is challenging to do this without blocking or otherwise obstructing the optical beam, which must also be focused onto an optical transmission medium. It is thus desirable to provide a detector that monitors the emitted optical beam without attenuating or compromising it.

Another issue associated with the use of VCSELs is that the light emitted from a VCSEL mounted on a module according to conventional techniques, is normal to the fiber launch direction used in most optical communication applications. Fiber-connected optoelectronics in high-speed applications typically require that light is advantageously emitted and received parallel to the plane of the module such as the surface of a printed circuit board. The launch direction of the optical fiber, along which light travels, is also preferably parallel to the plane of the module. In this manner, the light is emitted and received along a direction generally parallel to the path of the electric signal. It is therefore a challenge to mount a VCSEL within an optical subassembly mounted on a printed circuit board and which will be coupled to an optical fiber oriented generally parallel to the printed circuit board. When using vertically-transmitting optical devices such as VCSELs, either the electrical or optical path must make a 90° turn in order to achieve parallel connection with the fiber according to conventional packaging technologies. Mirrors may be used to bend the light 90° to try to focus the emitted light onto the end face of a fiber without compromising the quality of the optical signal. Even if the VCSEL is mounted such that it is rotated 90° with respect to the printed circuit board, the stability of the optical subassembly (OSA) mounted sideways on the board becomes a concern, and the nature and length of the electrical connections between the OSA and the board also becomes a concern, especially in high-frequency applications where a constant and controlled impedance is typically required. Moreover, there are space constraints in many applications that limit OSA designs, and therefore the ability to mount a vertically-emitting optical device within an OSA and perpendicular to the module such that it emits light parallel to the plane of the module. Any such space constraints associated with mounting an OSA on a printed circuit board mandate that the OSA be of minimal dimension, which may make it difficult to utilize OSAs large enough to include additional components capable of turning the optical path. Similar shortcomings and challenges may be present for mounting vertically-receiving optical devices as well.

The cost of an OSA generally increases with the number of components which combine to form the OSA. Such components typically include a separately formed and assembled ball lens to focus the light emitted from a laser into the end face of an optical fiber. It would therefore be desirable to reduce cost by eliminating components such as the ball lens.

What is needed to address the various shortcomings of the conventional technology, is a method and apparatus for mounting a vertically-emitting or receiving optical element in an optical subassembly such that the optical element is oriented to emit or receive light along a fiber launch direction that is parallel to the surface of the module on which the optical subassembly is mounted.

SUMMARY OF THE INVENTION

The present invention provides various embodiments of ceramic carriers, optical sub-assemblies, and assemblies in which the optical sub-assemblies are mounted on a mounting surface, and methods for forming the ceramic carriers and optical sub-assemblies, as well as methods and arrangements for mounting the optical sub-assemblies.

In one embodiment, the present invention provides an optical subassembly which includes a multilayer ceramic carrier. The ceramic carrier is formed of multiple ceramic layers. The multilayer ceramic carrier preferably includes a terraced cavity. An optical element may be mounted within the cavity such that it emits light in a direction generally orthogonal to the base surface of the terraced cavity. The terraced cavity preferably includes a terrace formed on at least one of the interior sidewalls, and conductive traces formed on at least one of the ceramic layers and which are interposed between the ceramic layers and internal with respect to the ceramic carrier. The multilayer ceramic carrier may form part of a TOSA (transmit optical subassembly) and include a VCSEL as the optical element.

According to another embodiment of the present invention, the multilayer ceramic carrier may form part of a ROSA (receive optical subassembly) and include a photodetector and associated components therein.

Another embodiment of the present invention includes a method for forming a multilayer ceramic carrier. In the preferred embodiment, the method includes providing a plurality of layers of ceramic tape, each having an aperture, and at least two of the apertures having different sizes. The method includes aligning the plurality of layers of ceramic tape over one another such that the apertures are aligned over one another, and the stack of plurality of layers is aligned over a bottom ceramic layer. The layers are preferably joined together, then co-fired at an elevated co-firing temperature to permanently join the ceramic layers.

Another embodiment of the present invention is an optical carrier which includes an optical source disposed within a terraced cavity. The terraced cavity includes conductive traces formed along at least one of the terraces of the terraced cavity. The optical source is wire-bonded to a conductive trace formed along the terrace. A photodetector is included within the terraced cavity and is capable of detecting light emitted by the optical source and monitoring optical power.

According to another exemplary embodiment, the present invention provides an optical component including a ceramic carrier having a bottom surface and an opposed top surface which is generally parallel to the bottom surface, a cavity extending down from the top surface and including interior sidewalls, and a base surface. A VCSEL and a photodetector are disposed on the base surface, the VCSEL capable of emitting light substantially orthogonal to the base surface, and the photodetector capable of monitoring light emitted by the VCSEL.

The present invention also preferably provides an optical subassembly including the ceramic carrier coupled to an optical housing. The ceramic carrier includes either a vertically-emitting or vertically-receiving optical element therein, and the optical subassembly is configured to be conterminously mounted on a mounting surface such that the optical element either emits light generally parallel to the mounting surface or receives light traveling generally parallel to the mounting surface. The optical housing includes an aperture for retaining an optical transmission medium within an optical ferrule such that the light emitted from the VCSEL travels along the optical transmission medium.

According to another embodiment of the present invention, a method for forming an optical subassembly by joining a ceramic carrier to an optical housing, is provided. The ceramic carrier includes a cavity extending from a first surface and includes a VCSEL disposed within the cavity such that the VCSEL emits light out of the cavity and perpendicular to the top surface. The method preferably includes providing an optical housing having opposed sets of legs and a cylindrical portion having an axis which is substantially parallel to the legs and capable of retaining an optical transmission medium. The method provides for covering the cavity with a glass member, then placing the legs on the top surface such that the legs of the optical housing straddle the glass, then aligning the optical housing to the ceramic carrier such that the optical elements are aligned, and fixing the optical housing into position with respect to the ceramic carrier by applying a first epoxy. The first epoxy is cured using either UV radiation, visible light, or RF curing, then the optical housing is secured to the ceramic carrier by applying and curing a second epoxy, the second epoxy being either thermally curable, UV-curable, RF curable, or visible light-curable.

Another embodiment of the present invention is an assembly including an optical subassembly mounted on a mounting surface of a board such that a vertically emitting or vertically receiving optical element included with the optical subassembly, emits or receives light along a direction generally parallel to the mounting surface. The optical subassembly includes a ceramic carrier coupled to an optical housing. The optical element is included within the ceramic carrier and includes an optical surface perpendicular to the mounting surface. The ceramic carrier includes an outer sidewall which is conterminously joined to the mounting surface.

According to yet another embodiment of the present invention, an assembly is provided which includes an optical element secured within an optical subassembly which is mounted adjacent an edge of a board such as a printed circuit board. The optical element may be a vertically-emitting optical element or a vertically-receiving optical element which is capable of emitting or receiving light a direction substantially parallel to the board.

The present invention preferably also provides a method for joining an optical subassembly to a printed circuit board such that the optical subassembly is mounted adjacent an edge of the printed circuit board, and a VCSEL included within the optical subassembly emits light generally parallel to the surface of the printed circuit board. The method includes the steps of providing an optical subassembly including a VCSEL oriented to emit light along a first direction, and a plurality of conductive leads extending from the optical subassembly substantially parallel to the first direction, providing a printed circuit board having an edge and including a plurality of conductive pads corresponding to the plurality of conductive leads extending to the edge, then joining the conductive leads of the optical subassembly to the corresponding conductive pads of the printed circuit board.

BRIEF DESCRIPTION OF THE DRAWINGS

The present invention is best understood from the following detailed description, when read in conjunction with the accompanying drawings. It is emphasized that, according to common practice, the various features of the drawing are not to scale. On the contrary, the dimensions of the various features are arbitrarily expanded or reduced for clarity and to emphasize features of the present invention. Like numerals refer to like features throughout the specification and drawing. Included in the drawings are the following figures.

DETAILED DESCRIPTION OF THE INVENTION

The present invention provides various embodiments of ceramic carriers, optical sub-assemblies, and assemblies in which the optical sub-assemblies are mounted on a mounting surface, and methods for forming the ceramic carriers and optical sub-assemblies, as well as methods and arrangements for mounting the optical sub-assemblies. The present invention covers both transmit optical sub-assemblies (TOSAs) and receive optical sub-assemblies (ROSAs). The various aspects of the present invention are preferably utilized in conjunction with vertically emitting devices such as VCSELs. Vertically emitting devices emit light out of the surface of the substrate in which they are formed. The present invention also may be used with vertically receiving devices that receive and detect light preferably directed vertically towards the surface of the substrate in which they are formed.

Figure 1:
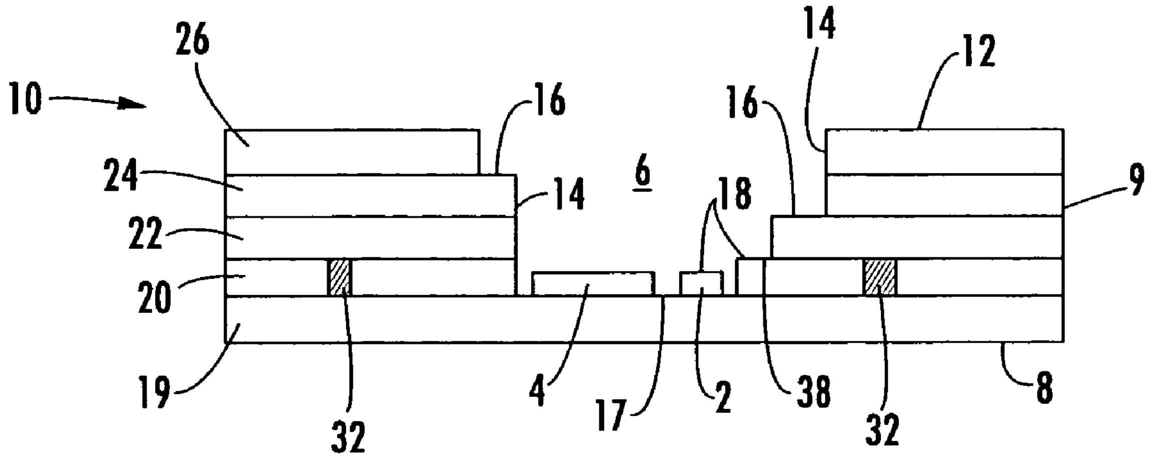
FIG. 1 is a cross-sectional view showing an exemplary embodiment of a multilayered ceramic carrier according to the present invention.

FIG. 1 is a cross-sectional view showing exemplary multilayer ceramic carrier 10. In the exemplary embodiment shown, ceramic carrier 10 is generally box-shaped and includes five layers, but any number of layers may be used according to other exemplary embodiments. In the exemplary embodiment shown in FIG. 1, ceramic carrier 10 includes bottom layer 19, top layer 26, and intermediate layers 20, 22 and 24. The layers are individually formed to have different-sized apertures, and the apertures are aligned over one another such that the formed ceramic carrier 10 includes terraced cavity 6. Terraced cavity 6 includes sidewalls 14 and terraces 16. Terraced cavity 16 may be formed centrally in ceramic carrier 10 or it may be off-center. Terraces 16 result when an underlying ceramic layer includes a section which extends into terraced cavity 6 to a greater extent than the overlying layer. In an exemplary embodiment, a conductive trace 38 extends along terrace 16. In the exemplary embodiment shown, ceramic carrier 10 includes top surface 12, bottom surface 8, and external sidewalls 9. In the exemplary embodiment shown, each of top surface 12 and opposed bottom surface 8 are substantially planar and parallel to one another. Terraced cavity 6 includes base surface 18, and VCSEL 2 and a photodetector 4 are disposed on base surface 17. VCSEL 2 is coupled to conductive trace 38 by means of wire bond 18. The thicknesses of each ceramic layers 19, 20, 22, 24 and 26 may range from 100 to 1500 microns. Other thicknesses may be used according to other exemplary embodiments.

Each of ceramic layers 19, 20, 22, 24 and 26 are preferably formed of co-fired ceramic tape. According to the various exemplary embodiments, a high-temperature co-fired ceramic tape (HTCC) or low-temperature co-fired ceramic (LTCC) material may be used as the ceramic tape. According to an exemplary embodiment, DuPont 951 Green Tape™ may be used. According to other exemplary embodiments, materials such as DuPont 943 Green Tape™ or Ferro A6M ceramic tape may be used. The ceramic tapes are typically formed of alumina, aluminum nitrate or other similar materials, but other suitable materials may be used alternatively. According to an exemplary embodiment, multiple sheets of ceramic tape are aligned over one another and permanently joined together to form an array of individual ceramic carriers (10) that are subsequently separated.

Traces of conductive material may be formed on the individual ceramic layers prior to assembly, using conventional methods and conventional conductive materials. In an exemplary embodiment in which low-temperature co-fired ceramic is used, metals such as silver (Ag) and gold (Au) may be used as the conductive material. In HTCC applications, tungsten, W or tungsten-molybdenum WMo may be used due to their higher melting temperatures. In high-frequency applications, materials of the highest conductivity such as silver and gold are preferred, and therefore an LTCC process is typically used in high-speed applications. Any or all of the individual ceramic layers of the array may include vias 32 that extend through the ceramic layer and electrically couple conductive traces formed on the layers. According to the exemplary embodiment in which conductive traces are formed on the individual ceramic layers prior to assembly, the assembled multilayer ceramic carrier 10 therefore includes conductive traces formed integrally therein and disposed between adjacent ceramic layers such as between layer 22 and layer 24. In an exemplary embodiment, a portion of one or more conductive traces preferably extends into terraced cavity 6 along at least one terrace 16 formed within terraced cavity 6. The conductive trace thereby terminates within terraced cavity 6 and is electrically coupled by way of wire bonding or other means, to a VCSEL, photodetector, or other optical component formed within terraced cavity 6. Conductive traces may additionally or alternatively be formed along base surface 17. In an alternative embodiment, either of VCSEL 2, photodetector 4, or various other electrical components included within cavity 6, may be coupled to the conductive traces formed on base surface 17.

The method for forming ceramic carrier 10 includes aligning sheets of the ceramic tape which form the component layers, such as layers 19, 20, 22, 24 and 26, over one another, then permanently joining the layers. In an exemplary embodiment, all but the lower of the ceramic layers will include an aperture therethrough. The apertures may be of different size and are aligned over one another to form terraced cavity 6. Terraces such as terrace 16 may be formed along any or all of internal sidewalls 14. Terraces 16 may extend partially or completely along respective sidewalls 14. In an exemplary embodiment, terraces which are formed on opposite internal sidewalls 14 may be at the same level within terraced cavity 6, or they may be formed at different levels such as shown in exemplary FIG. 1. After the individual layers of ceramic tape are aligned over one another, the sheets may be joined using a nominal temperature of about 80° C., but other temperatures may be used alternatively. After the sheets are joined together, the ceramic carriers are co-fired in a furnace according to conventional methods. For HTTC materials, co-firing temperatures on the order of 1600° may be used, and for LTCC materials, an exemplary co-firing of about 800° may be used. The preceding temperatures are intended to be exemplary only, and other temperatures may be used in each case. According to the embodiment in which sheets of ceramic tape are joined together to form an array of ceramic carriers 10, the individual ceramic carriers 10 may be separated into individual ceramic carriers, either prior to or after the co-firing operation. Conventional processes may be used to separate the individual ceramic carriers 10.

Figure 2:
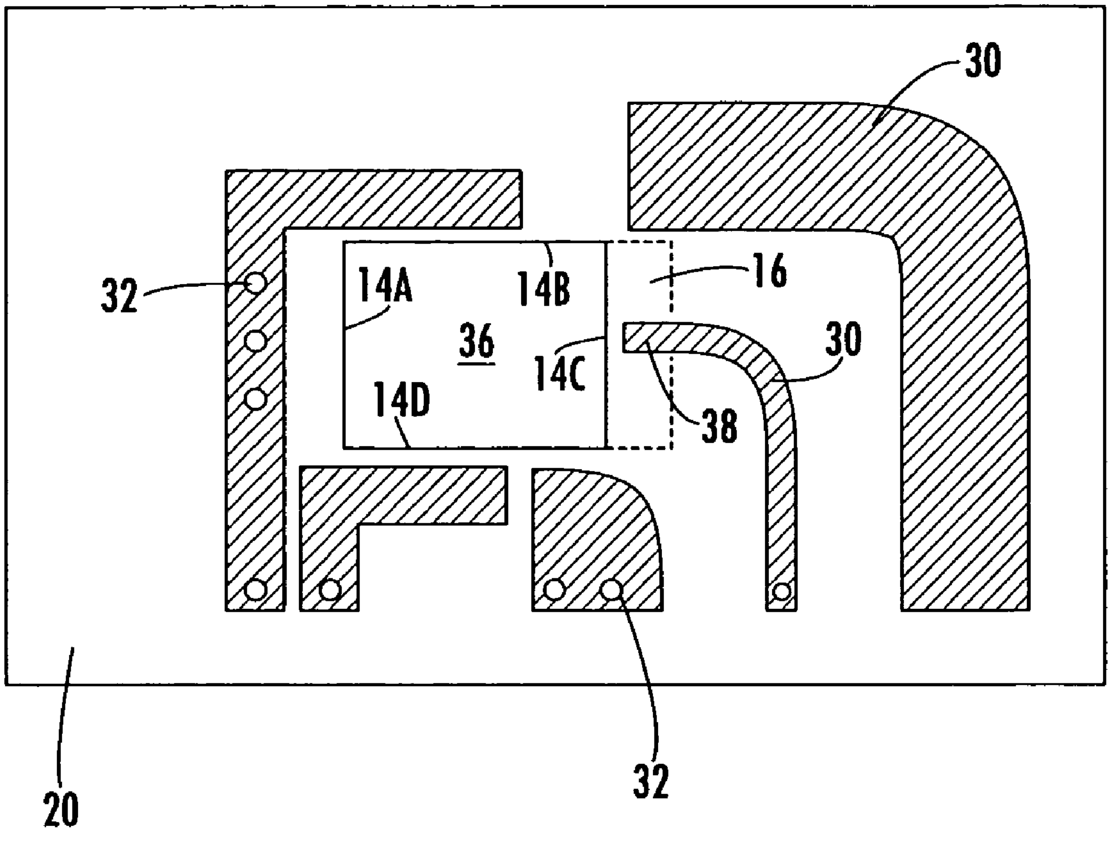
FIG. 2 is a plan view of conductive traces formed on a ceramic layer of the ceramic carrier such as shown in FIG. 1.

FIG. 2 is a plan view showing exemplary layer 20 of ceramic carrier 10. FIG. 2 shows exemplary conductive traces 30 and conductive vias 32, which extend through ceramic layer 20 and couple conductive traces 30 to corresponding conductive traces formed on a layer or layers beneath ceramic layer 20 such as conductive traces that may be formed on ceramic layer 19, shown in FIG. 1. When the layers are joined together to form an integral ceramic carrier 10 such as shown in FIG. 1, conductive traces 30 are integral to the ceramic carrier and interposed between the individual layers and coupled to other conductive traces formed on other integral layers by way of the conductive vias. Ceramic layer 20 also includes aperture 36 which defines and forms part of terraced cavity 6 in the integral unit. In the exemplary embodiment shown in FIG. 1, layer 20 is the wire-bonding shelf which includes a portion 38 of conductive trace 30 which extends into terraced cavity 6 such as shown in FIG. 1. The portion of ceramic layer 20 which forms terrace 16 in ceramic carrier 10 is shown by the dashed line in FIG. 2.

Figure 3:
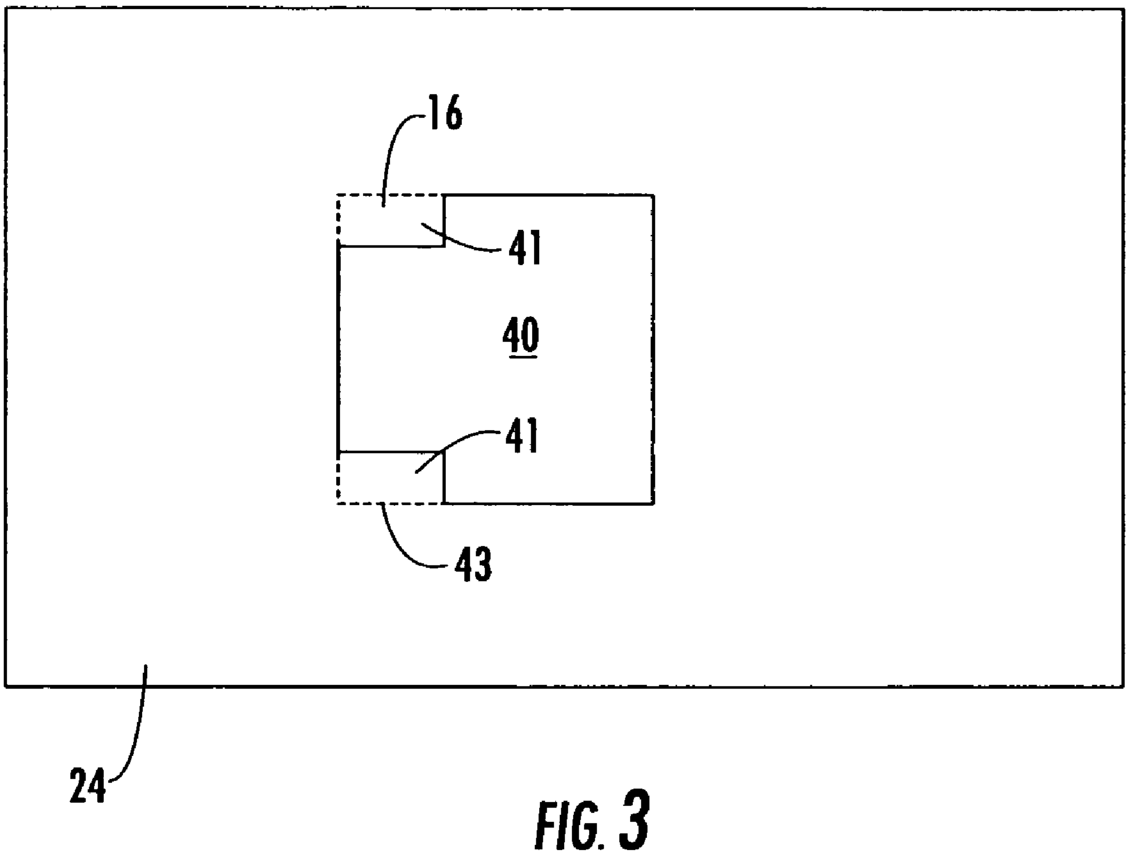
FIG. 3 is a plan view showing another exemplary ceramic layer which includes an exemplary aperture.

FIG. 3 is a plan view showing an exemplary ceramic layer such as ceramic layer 24 of multilayer ceramic carrier 10 shown in FIG. 1. Ceramic layer 24 includes cut-out or aperture 40 which extends through ceramic layer 22. The aperture, as well as aperture 36 of ceramic layer 20 such as shown in FIG. 2, may be formed using a conventional punching operation which punches a hole through the ceramic layers when they are in tape form, but other techniques may be used alternatively. The apertures may be formed in many of the ceramic layers, and may be of different dimension and configuration. The cut-outs or apertures are aligned over one another in the multilayer ceramic carrier 10. Corners 41 of ceramic layer 24 which extend into aperture 40 may be aligned over a similar structure in the subjacent layers and may therefore form terraces 16 if the opening formed in a superjacent layer or layers, is larger than aperture 40. For example, if the aperture formed in a superjacent layer such as layer 26 shown in FIG. 1, is bounded by dashed line 43, then corners 41 will form terraces 16.

Returning to FIG. 1, it can be seen that the opposed terraces 16 shown as formed along opposed sidewalls 14 of terraced cavity 6 are formed from different ceramic layers and are therefore of different heights within terraced cavity 6. Stated alternatively, the opposed terraces are formed on stacks comprised of different numbers of ceramic layers. The dimensions of terraced cavity 6, the shape of the cavity, and the vertical and horizontal dimensions of the ceramic carrier will vary by application, and therefore, any suitable set of dimensions may be used. Terraces may be formed along the entirety or portions of either or all of the interior sidewalls such as sidewalls 14A, 14B, 14C and 14D shown in FIG. 2.

Figure 4:
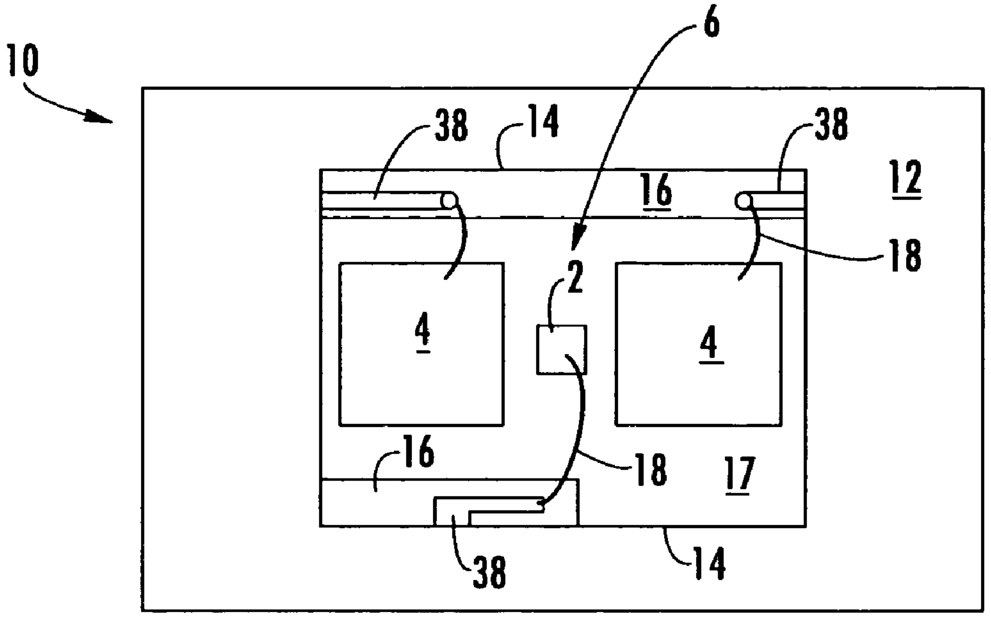
FIG. 4 is a plan view showing an exemplary arrangement of a VCSEL and two photodetectors within a ceramic carrier.

FIG. 4 is a top view showing terraced cavity 6 of ceramic carrier 10. Terraced cavity 6 includes two terraces 16 formed on opposed sidewalls 14. Base surface 17 of terraced cavity 6 is substantially parallel to top surface 12 in the exemplary embodiment. Exemplary VCSEL 2 and exemplary photodetectors 4 are disposed on base surface 17. In the exemplary embodiment, photodetectors 4 are formed on opposed sides of VCSEL 2, but other arrangements may be used according to other exemplary embodiments. Each of VCSEL 2 and photodetectors 4 include a wire bond 18 coupling the component to portion 38 of conductive traces formed on terrace 16. In another exemplary embodiment, VCSEL 2 and photodetectors 4 may be wire bonded to conductive traces formed on base surface 17 (not shown). VCSEL 2 may be a top side emitting VCSEL or a bottom side emitting VCSEL. By top side emitting VCSEL, it is meant that the VCSEL emits light out of an emitting surface formed on the substrate surface on which the VCSEL is formed. In an exemplary embodiment, VCSEL 2 and photodetector 4 may be integrally formed on the same substrate such as described in U.S. application Ser. No. 09/348,353, entitled CLOSELY-SPACED VCSEL AND PHOTODETECTOR FOR APPLICATIONS REQUIRING THEIR INDEPENDENT OPERATION, filed Jul. 7, 1999, the contents of which are herein incorporated by reference.

Various other additional and alternative components may be included within terraced cavity 6, and arranged in various other configurations, according to other alternative embodiments. Terraced cavity 6, for example, may be formed large enough to include additional semiconductor and electronic components besides the primary optoelectronic device. Additional components that may be included in terraced cavity 6 of ceramic carrier 10 are resistors, monitor diodes, capacitors, inductors, and laser drivers in the exemplary embodiment in which the OSA is a transmit optical subassembly (TOSA). According to the exemplary embodiment in which the optical subassembly is a ROSA (receive optical subassembly), transimpedance amplifiers, transimpedance limiting amplifiers, resistors, capacitors, inductors, and high speed detectors may be among the components additionally included within the OSA. Each of these components may be wire bonded to conductive traces which extend into terraced cavity 6. The photodetectors discussed in the present application, such as photodetector 4, may be photodiodes or other suitable vertically receiving monitor photodetectors or monitor diodes used in the optoelectronics industry. In an exemplary embodiment, photodetector 4 may be a p-i-n photodetector. The exemplary p-i-n photodetector may be configured to detect light from the top side or the bottom side. For brevity, the singular term "photodetector" will be used hereinafter, to describe all such photodetector devices. The VCSELs, photodetectors and other components may be joined to base surface 17 using conventional mounting techniques. They may, for example, be flip-chip mounted, preferably when a bottom emitting VCSEL, or bottom detecting photodetector is used.

Figure 5:
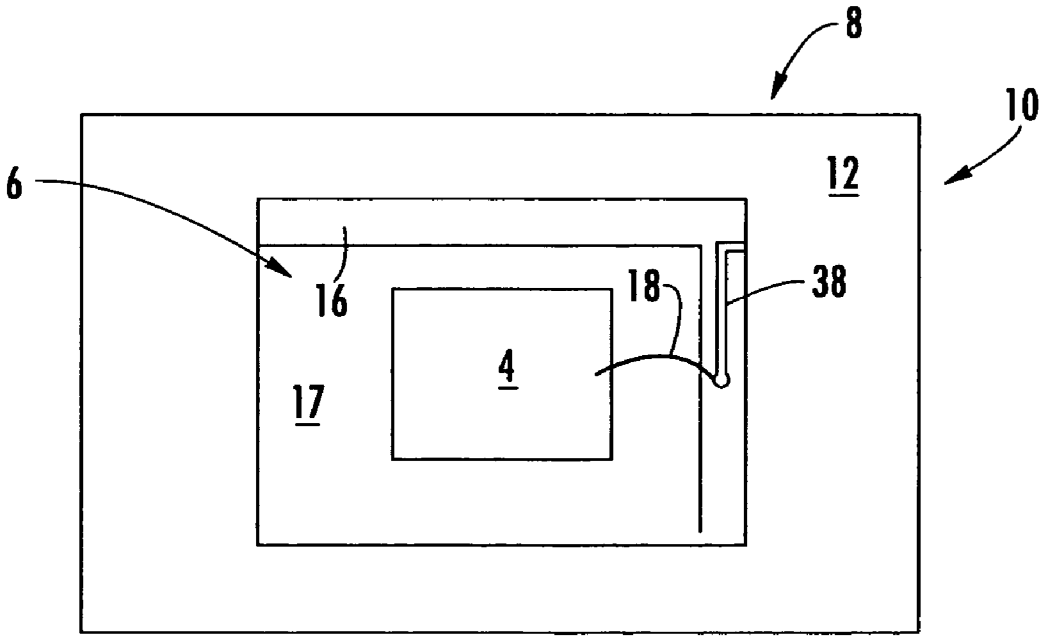
FIG. 5 is a plan view showing an exemplary arrangement of a photodetector within a ceramic carrier.

FIG. 5 is a plan view showing another exemplary ceramic carrier 10 including terraced cavity 6. Terraced cavity 6 includes base surface 17 which is parallel to top surface 12 and also parallel to bottom surface 8. Photodetector 4 is mounted on base surface 17 and electrically coupled by means of wire bond 18 to portion 38 of a conductive trace. According to an exemplary embodiment, this ROSA arrangement will advantageously include additional devices, such as a transimpedance amplifier or transimpedance limiting amplifier (not shown) disposed on base surface 17 along with photodetector 4 to aid in processing the optical signal received by photodetector 4, and converting the optical signal to an electrical signal. According to other exemplary embodiments in which the optical subassembly is a ROSA, other additional components, as above, may be included within the OSA.

In each of the exemplary embodiments shown in FIGS. 4 and 5, the conductive traces that include portion 38, which extends into terraced cavity 6, further extend integrally within ceramic carrier 10 and preferably between the stacked ceramic layers which combine to form ceramic carrier 10.

Figure 6:
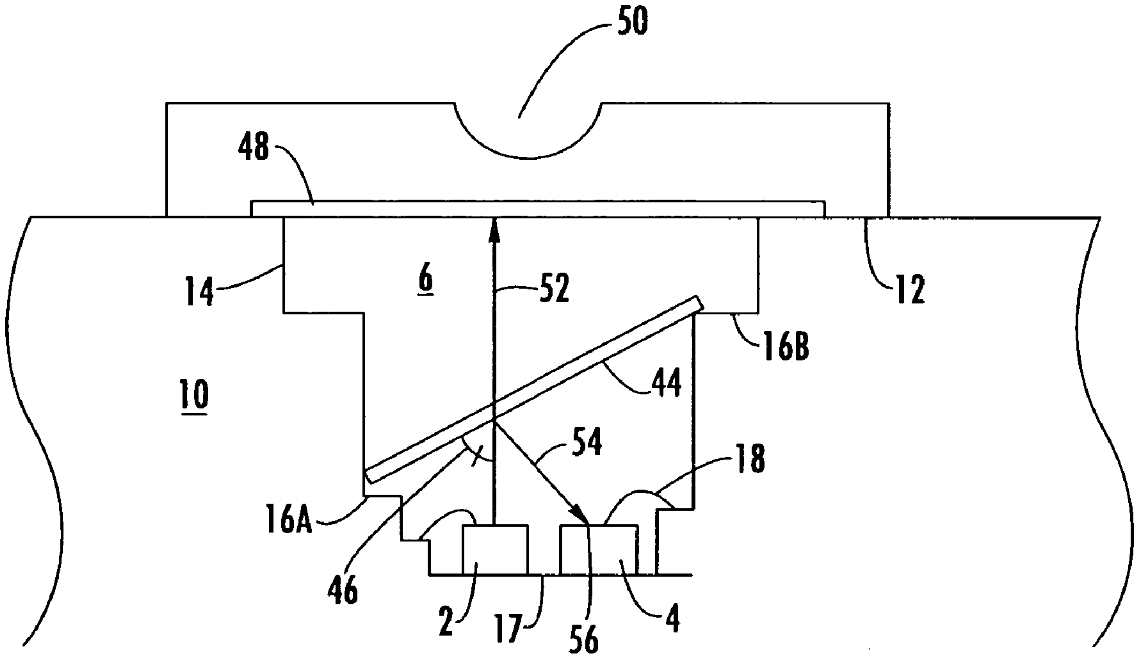
FIG. 6 is a cross-sectional view showing an exemplary embodiment of a VCSEL and a photodetector within a ceramic carrier.

FIG. 6 is a cross-sectional view showing an exemplary arrangement of components within exemplary terraced cavity 6 of ceramic carrier 10. In this exemplary embodiment, multiple terraces 16 are formed at various heights. FIG. 6 shows VCSEL 2 and photodiode 4 each formed on base surface 17. Each of VCSEL 2 and photodetector 4 are wire-bonded to conductive traces and to further electrical components (not shown) by means of wire bond 18. The wire bonding may be carried out using conventional means. VCSEL 2 and photodetector 4 are arranged adjacent one another on base surface 17. In this manner, the emitting surface of the VCSEL and absorbing surface 56 of photodetector 4 are preferably parallel to each other and the base surface as well as the top surface 12 and the bottom surface (not shown) of ceramic carrier 10.

Reflective/transmissive member 44 preferably rests on opposed terraces 16A and 16B which are shown to be different heights. Reflective/transmissive member 44 is therefore acutely angled with respect to base surface 17 and not parallel to base surface 17. VCSEL 2 preferably emits light along direction 52 which is substantially orthogonal to base surface 17, top surface 12, and the bottom surface (not shown) of the ceramic carrier 10. Reflective/transmissive member 44 forms tilt angle 46 with respect to direction 52 of light emitted by VCSEL 2. Reflective/transmissive member 44 is chosen so that a majority of light emitted by VCSEL 2 is preferably transmitted through the member and may be focused onto an optical fiber or other optical transmission medium (not shown) disposed above optical lens 50. Exemplary optical lens 50 will be discussed below in conjunction with the optical housing joined to ceramic carrier 10 to form an optical subassembly (OSA). In an exemplary embodiment, 8–9% of the light emitted by VCSEL 2 is reflected by the reflective/transmissive member 44 but other percentages may be achieved according to other embodiments. Reflective/transmissive member 44 may be formed of glass according to one exemplary embodiment, but other materials may be used according to other exemplary embodiments. The glass may be formed of standard borosilicate materials, such as BK7. The glass or other reflective/transmissive member 44 may further be coated with a thin coating of reflective material such as aluminum fluoride or magnesium fluoride to vary the reflectivity of reflective/transmissive member 44. Tilt angle 46 is chosen such that reflected portion 54 of light emitted by VCSEL 2 and reflected by reflective/transmissive member 44 is preferably directed onto absorbing surface 56 of photodetector 4 so that photodetector 4 can be used to monitor the optical output power of VCSEL 2. Reflective/transmissive member 44 is preferably chosen to reflect a known percentage of emitted light. According to other exemplary embodiments, the percentage of emitted light which is reflected by reflective/transmissive member 44 and detected by photodetector 4, may be determined experimentally using various techniques. In this manner, then, the amount of light detected by photodetector 4 corresponds to a known total amount of light emitted by VCSEL 2. Alternatively stated, the amount of light sensed by photodetector 4 can be correlated to an optical output power of VCSEL 2. It can be understood that opposed terraces 16A and 16B can be configured to determine tilt angle 46, which may be varied and that the photodetector may be placed in various positions to accept a suitable amount of reflected light. In an exemplary embodiment, reflective/transmissive member 44 may be joined to ceramic carrier 10 to produce a hermetic seal beneath reflective/transmissive member 44.

The exemplary arrangement shown in FIG. 6 also includes second reflective/transmissive member 48. Second reflective/transmissive member 48 is joined to top surface 12 of ceramic carrier 10 and covers terraced cavity 6. In an exemplary embodiment, second reflective/transmissive member 48 may be joined to top surface 12 such that it hermetically seals terraced cavity 6 of ceramic carrier 10. Second reflective/transmissive member 48 may be formed of glass in an exemplary embodiment and may be coated as described in conjunction with reflective/transmissive member 44. Other materials may be used to form second reflective/transmissive member 48 according to other exemplary embodiments. Hereinafter, second reflective/transmissive member 48 will be simply referred to as glass cover 48, but it should be understood that alternative materials may be used. Glass cover 48 may be arranged to reflect a known or determined portion of light emitted by VCSEL 2, such that it may be detected by photodetector 4. As will be shown below, photodetector 4 may be configured to sense light which is emitted by VCSEL 2 and reflected off of either or both of glass cover 48 and optical lens 50. Optical lens 50 is part of an optical housing joined to ceramic carrier, as will be described below.

Photodetector 4 can therefore be used to monitor the optical output of VCSEL 2. Various conventional methods, feedback loops, and analytical means may be used in conjunction with various electrical circuits to adjust the optical power of VCSEL 2 based on the amount of light detected by photodetector 4. Photodetector 4 may be formed using conventional methods and will preferably be formed of a material which has good absorption characteristics at the wavelength of light being used. In an exemplary embodiment, silicon may be used as photodetector 4, and used for detecting 850 nm light emitted by VCSEL 2. According to other exemplary embodiments, VCSEL 2 may emit light at any of various other wavelengths ranging up to 1650 nm. Photodetector 4 is chosen for compatibility with the wavelength of light emitted by VCSEL 2.

The dimensions of terraced cavity 6 are chosen and components such as VCSEL 2 and photodetector 4 are positioned so that the length of wire bond 18 is minimal. This is especially desirable for high frequency applications in which a controlled and constant impedance is essential at the operating frequency used. It should be understood that the configuration of components with terraced cavity 6 and the shape of terraced cavity 6 as shown in FIG. 6 is exemplary only and various other arrangements of components, configurations of terraced cavity 6 and means for hermetically sealing terraced cavity 6 may be used according to other exemplary embodiments.

According to other exemplary embodiments, ceramic carrier 10 may be formed of materials other than layers of ceramic tape. According to yet another exemplary embodiment, a carrier shaped and configured such as ceramic carrier 10 may be formed to include a terraced cavity and conductive traces formed along the terraces and which are electrically coupled to optical components within terraced cavity, may be formed of other materials. In an exemplary embodiment, the carrier may be formed of multiple layers of printed circuit board material or other suitable dielectric or polymeric materials. The ceramic carrier may be formed of materials such as FR4, Duroid, Isoclad, Arlon, or other suitable conventional materials. The carrier may be formed by machining or it may be formed by stacking a plurality of discrete layers over one another such as described in conjunction with the discrete layers of ceramic tape used to form multilayer ceramic carrier 10, as shown and described herein.

Figure 7:
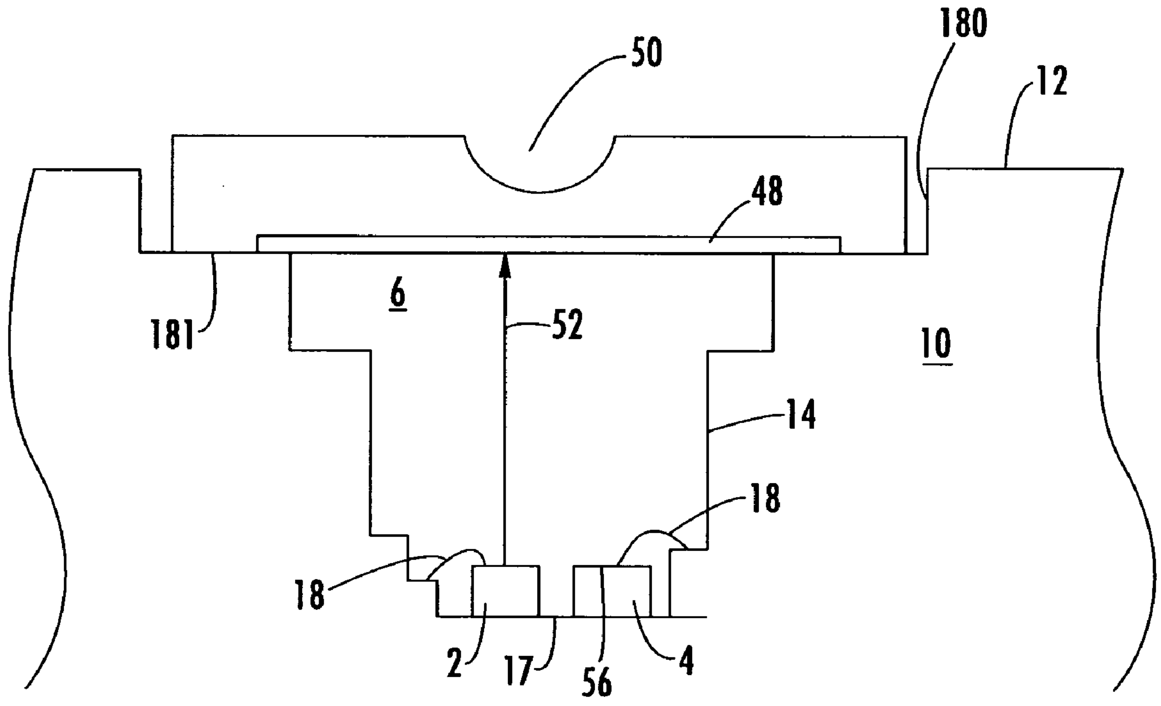
FIG. 7 is a cross-sectional view showing another exemplary embodiment of a VCSEL and a photodetector within a ceramic carrier.

FIG. 7 shows another exemplary arrangement of components within terraced cavity 6 of ceramic carrier 10. The arrangement shown in FIG. 7 is substantially similar to the arrangement shown in FIG. 6, except the angled, reflective/transmissive member shown in FIG. 6, is not present. Additionally, glass cover 48 is formed within recessed portion 180 which is recessed below top surface 12 of ceramic carrier 10. More specifically, glass cover 48 is joined to recessed surface 181 of recessed portion 180. In the exemplary embodiment shown in FIG. 7, photodetector 4 may be configured to detect light emitted by VCSEL 2 and reflected by optical lens 50, glass cover 48, or both of optical lens 50 and glass cover 48. Optical lens 50 is formed of an optical housing joined to ceramic carrier 10. Optical lens 50 is formed and configured to direct light emitted by VCSEL 2 onto an optical transmission medium such as an optical fiber (not shown). Optical lens 50 may be coated with a reflective material to reflect part of the light emitted by VCSEL 2, onto absorbing surface 56 of photodetector 4.

Figure 9:
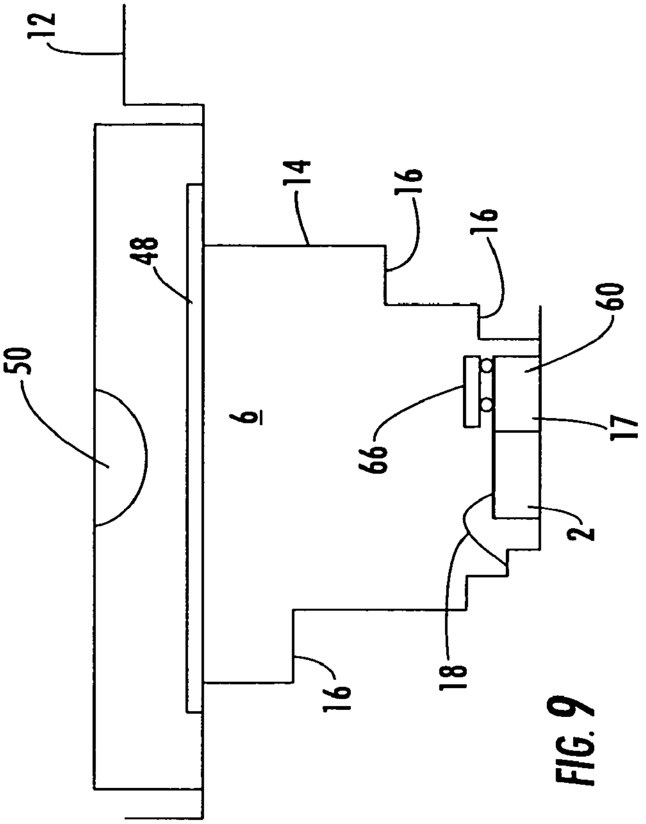
FIG. 9 is a cross-sectional view of another exemplary embodiment showing two VCSELs and a photodetector formed within a terraced cavity formed within the ceramic carrier.
Figure 8:
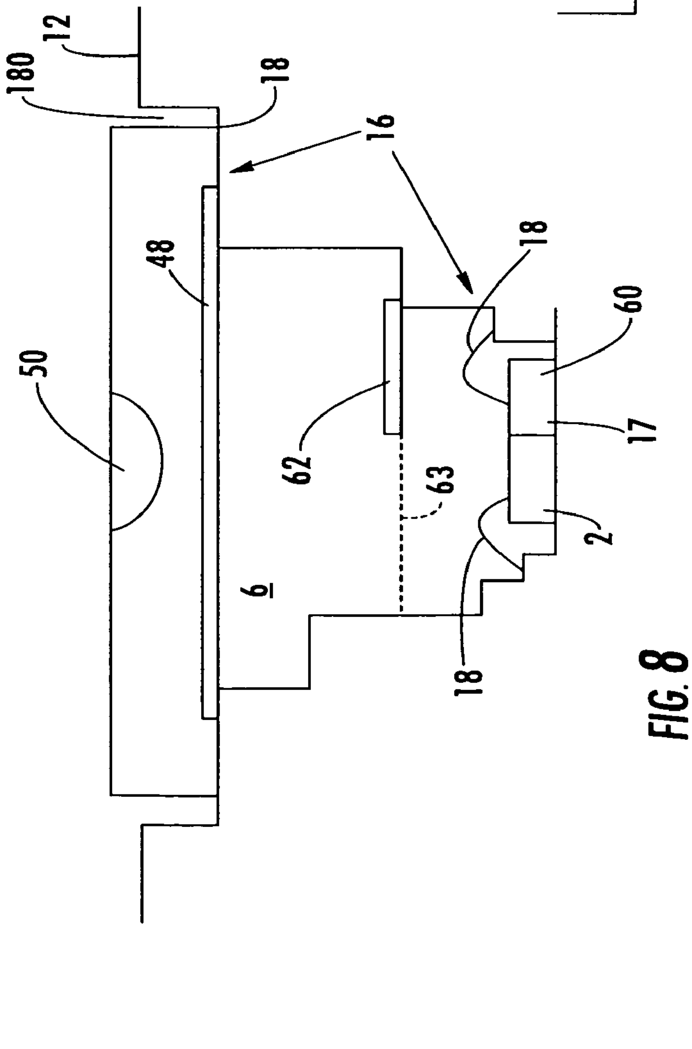
FIG. 8 is a cross-sectional view showing another exemplary embodiment including two VCSELs and a photodetector within a terraced cavity formed within a ceramic carrier.

FIGS. 8 and 9 are each cross-sectional views showing additional exemplary embodiments of arrangements of optical components within terraced cavity 6, according to the present invention. In FIG. 8, two VCSELs, VCSEL 2 and VCSEL 60 are shown and situated adjacent to one another. VCSELs 2 and 60 are preferably chosen to have virtually the same optical performance characteristics. According to one exemplary embodiment, the two VCSELs, 2 and 60 may be formed from the same substrate. VCSELs 2 and 60 are chosen such that when identical electrical power is applied to each of the VCSELs, the optical output of one is substantially the same as the optical output of the other. It can be seen that each of the two VCSELs, 2 and 60, are wire bonded by means of wire bond 18 to respective terraces 16. The terraces to which the VCSELs are wire bonded include conductive traces thereon for electrically coupling each of the VCSELs to other electrical components. Short wire bonds are preferably used. In FIG. 8, photodetector 62 is positioned over VCSEL 60. Photodetector 62 may be joined to terrace 16, which may extend across terraced cavity 6, as indicated by dashed line 63, in the exemplary embodiment shown. Conventional means may be used to position and secure photodetector 62 over VCSEL 60. According to this exemplary embodiment, VCSEL 2 is the data laser which emits the optical signal that is preferably coupled to an optical transmission medium. The light emitted from VCSEL 60 is directed at photodetector 62 which may be a photodiode according to the exemplary embodiment. In an exemplary embodiment, VCSELs 2 and 60 are driven in parallel by common circuitry. Since it is known that VCSEL 2 and VCSEL 60 have substantially the same electrical and optical properties, the optical power sensed by photodetector 62 which senses light emitted from VCSEL 60, is identical, or at least representative of, light emitted by VCSEL 2 and therefore the optical signal. In this manner, light detected by photodetector 62 may preferably be used to adjust the optical power of VCSEL 2 which supplies the optical signal to the optical transmission medium. Various methods and electrical circuits may be used for this feedback loop.

Referring to FIG. 9, photodetector 66 may alternatively be mounted directly on VCSEL 60 using conventional methods such as solder bumps and flip-chip mounting techniques. According to yet another exemplary embodiment, a clear epoxy may be used to join photodetector 66 to VCSEL 60. According to the exemplary embodiments shown in FIGS. 8 and 9, the present invention enables the monitor photodetector to capture essentially all of the light emitted from VCSEL 60. This enables monitoring of the AC power which may be used to provide a constant extinction ratio. It should also be understood that in the embodiment in which the photodetector is mounted directly on the VCSEL, the cavity may alternatively be formed having straight sidewalls, and without terraces, or may otherwise be configured to house the second VCSEL and monitoring photodiode.

Figure 10:
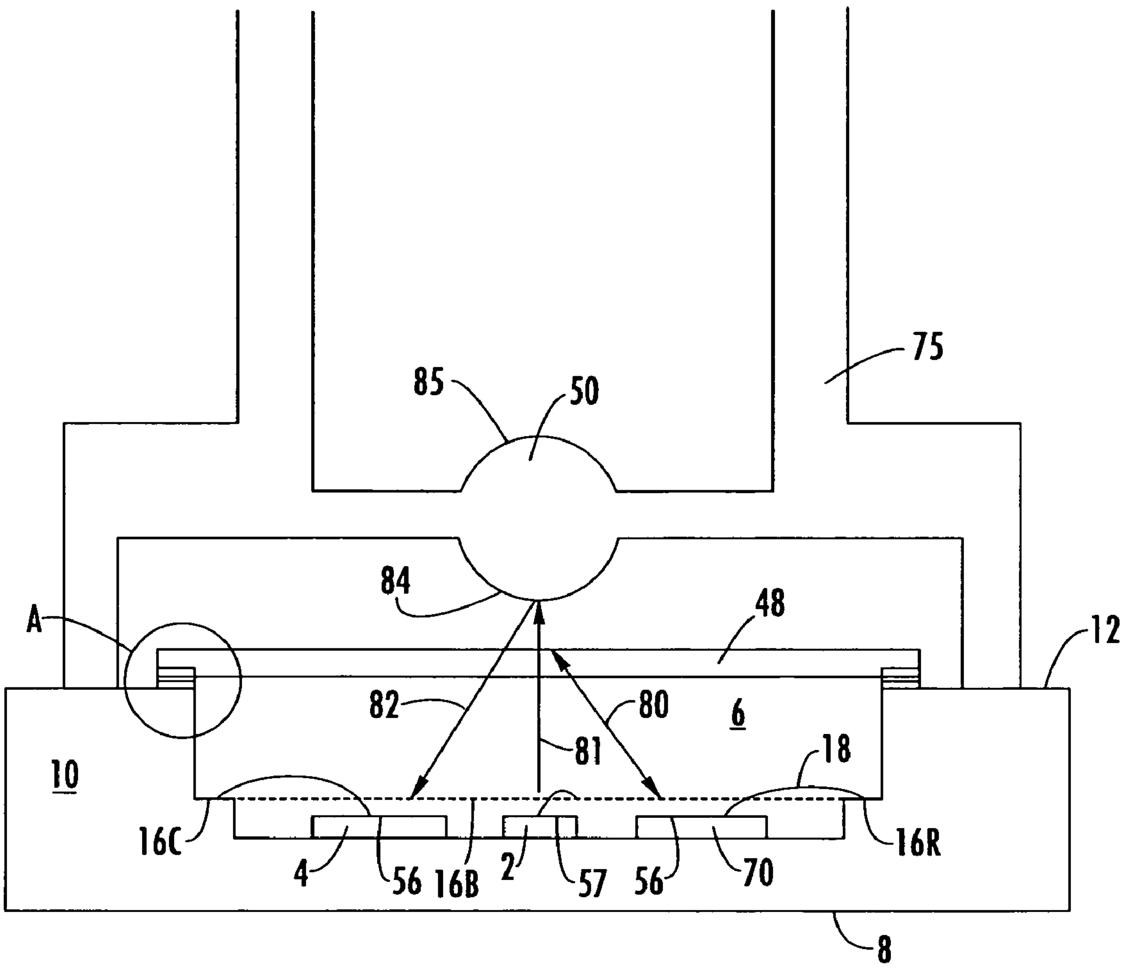
FIG. 10 is a cross-sectional view of another exemplary embodiment showing a VCSEL and two photodetectors formed within a terraced cavity and coupled to an optical housing.

FIG. 10 is a cross-sectional view showing another exemplary arrangement of components within terraced cavity 6 of ceramic carrier 10. FIG. 10 shows VCSEL 2, photodetector 4, and further photodetector 70 formed on base surface 17 of terraced cavity 6. Each of photodetector 4 and further photodetector 70 include absorbing surfaces 56 which are generally parallel to emitting surface 57 of VCSEL 2. Photodetector 4 is wire bonded to terrace 16L, further photodetector 70 is wire bonded to terrace 16R, and photodetector 7 is wire bonded to a terrace 16B which may be formed to the rear of the cross-sectional view shown in FIG. 10, and is indicated by dashed line 16B. Optical housing 75 includes optical lens 50 and is mechanically coupled to multilayer ceramic carrier 10. Ball lens 50 may be spherical or aspherical and includes surface 84 which faces VCSEL 2 and surface 85 opposite surface 84. According to various exemplary embodiments, either or both of surface 84 and surface 85, may be coated with various materials to enhance or reduce the reflection of the light emitted by VCSEL 2 while also focusing emitted light 81 onto a further component such as an optical transmission medium (not shown) and reducing optical coupling of light back into VCSEL 2. According to another exemplary embodiment, ball lens 50 may be formed of multiple components such that an interface surface is formed between surfaces 84 and 85 of ball lens 50.

According to the exemplary embodiment shown, VCSEL 2 emits emitted light 81 in a direction generally orthogonal to emitting surface 57 of VCSEL 2, base surface 17, and top surface 12. A portion of emitted light 81 is preferably refracted within glass cover 48 and reflected from the top surface of glass cover 48 as reflected light 80. Reflected light 80 is directed towards absorbing surface 50 of further VCSEL 70. According to another exemplary embodiment, a portion of emitted light 81 may be reflected from the lower surface of glass cover 48 and reflected towards further photodetector 70. Glass cover 48 is chosen such that a majority of emitted light 81 is preferably transmitted through glass cover 48. An anti-reflective coating may be formed on either or both of top surface 90 and interior surface 78 of glass cover 48. As an alternative to, or in addition to, light reflected from glass cover 48, a portion of emitted light 81 may be reflected from surface 84 of ball lens 50 and directed as reflected light 82 which is directed towards photodetector 4. According to one exemplary embodiment, two photodetectors may be used and disposed adjacent opposite sides of VCSEL 2. In one exemplary embodiment, only light reflected by glass cover 48 may be directed to and absorbed by the photodetectors. According to another exemplary embodiment, only light reflected by surface 84 of ball lens 50 may be directed towards and detected by each of photodetector 4 and further photodetector 70. According to one exemplary embodiment, ball lens 50 may be formed integrally with optical housing 75. Ball lens 50 may be formed of a plastic chosen to be transmissive to the wavelength of light emitted by VCSEL 2. According to another exemplary embodiment, ball lens 50 may be formed separately and positioned within optical housing 75. Ball lens 50 may be formed of quartz, glass, or other materials conventionally used as lens materials.

According to each of the exemplary arrangements of optical components shown in the preceding figures, other components may additionally or alternatively be formed within terraced cavity 6 of ceramic carrier 10. According to an exemplary embodiment, an integrated circuit or other semiconductor devices listed above, may additionally or alternatively be included within terraced cavity 6.

Still referring to FIG. 10, glass cover 48 is joined to top surface 12 of ceramic carrier 10. According to another exemplary embodiment, glass cover 48 may be joined to a recessed portion which is recessed below top surface 12. Glass cover 48 is joined to ceramic carrier 10 using exemplary features shown in FIG. 10A.

Figure 10A:
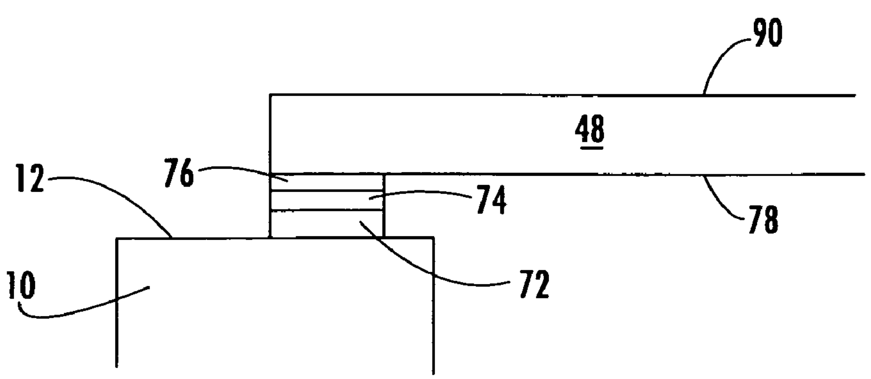
FIG. 10A is an expanded cross-sectional view showing a glass member joined to the ceramic carrier.

FIG. 10A is an expanded view showing a portion of FIG. 10, and showing glass cover 48 joined to top surface 12 of ceramic carrier 10. According to the embodiment shown in FIG. 10A, the seal formed between ceramic carrier 10 and glass cover 48, is a hermetic seal. The hermetic seal is provided by ring 72 formed on surface 12, solder pre-form 74, and seal ring 76 formed on internal surface 78 of glass cover 48. The components are joined using a method described in conjunction with FIG. 11.

Figure 11:
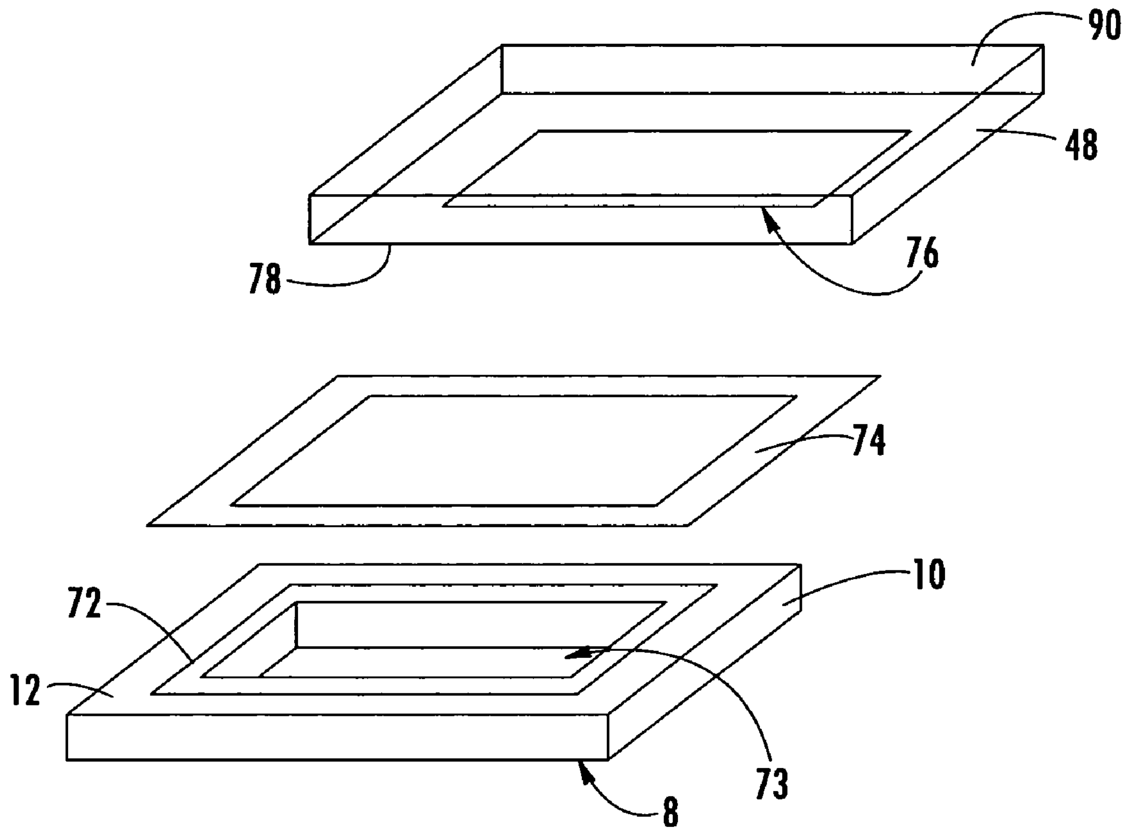
FIG. 11 is an expanded perspective view of the ceramic carrier, solder pre-form, and glass member of an exemplary optical subassembly prior to the components being joined.

FIG. 11 shows ceramic carrier 10 including cavity 73 extending downward from top surface 12. Cavity 73 may be formed centrally on top surface 12, or it may be off-center. Cavity 73 may be the terraced cavity shown and described above, or it may be a non-terraced cavity. Glass cover 48 includes internal surface 78 which faces, and will be joined to, top surface 12. Glass cover 48 also includes top surface 90. An anti-reflective coating may be formed on either or both of top surface 90 and interior surface 78 as described previously. Glass cover 48 includes seal ring 76 preferably attached to interior surface 78 with a glass frit. Seal ring 76 is used to solder glass cover 48 to a corresponding ring 72 formed on ceramic carrier 10. Ceramic carrier 10 includes ring 72 formed on top surface 12. Ring 72 may be formed of metal or kovar and may be a conductive trace formed of conventional conductive materials. Seal ring 76 may also be formed of conventional conductive material such as “Alloy 52.” Solder pre-form 74 is preferably positioned between ceramic carrier 10 and glass cover 48. Ring 72, solder pre-form 74 and seal ring 76 are preferably substantially the same size and shape or at least include a common boundary, and are aligned to one another; then the components are preferably joined to one another by soldering. In an exemplary embodiment, solder pre-form 74 may be pre-attached to seal ring 76 of glass cover 48. After the components shown in FIG. 11 are joined together by soldering and cavity 73 is thereby sealed, ceramic carrier 10 is ready to be joined to an optical housing. According to other exemplary embodiments, other techniques may be used to join glass cover 48 to top surface 12.

Figure 12:
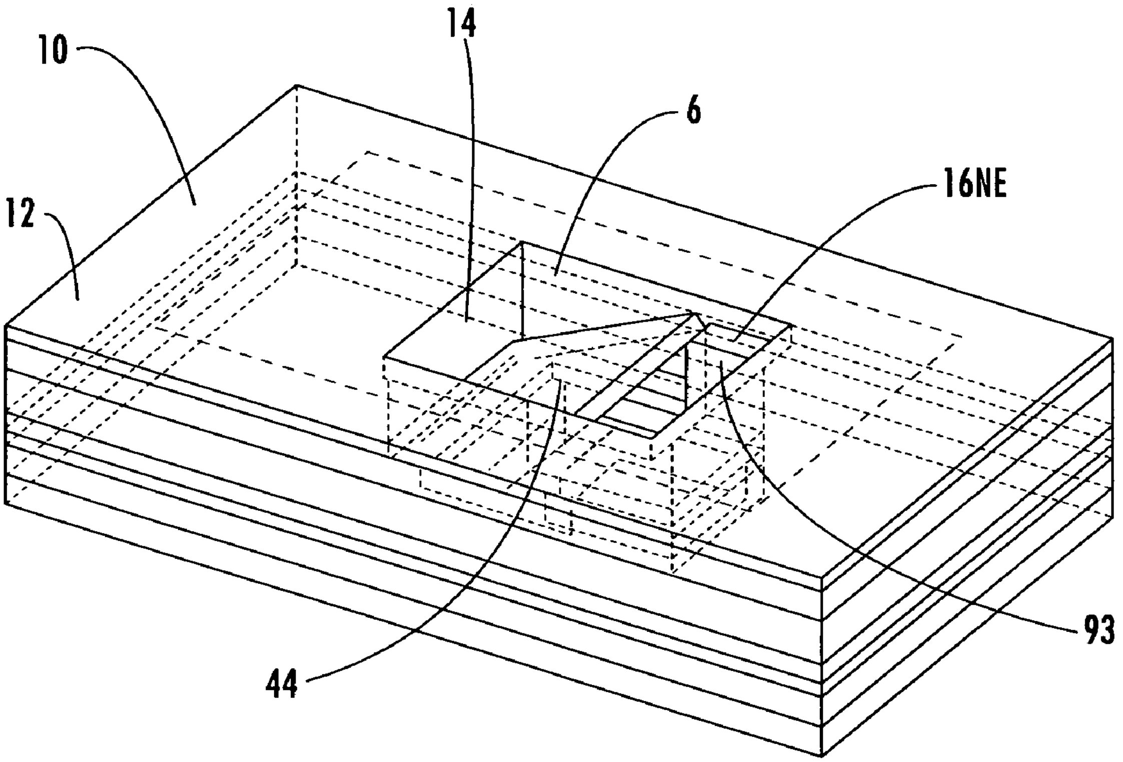
FIG. 12 is a perspective view of an exemplary embodiment of a ceramic carrier according to the present invention.

FIG. 12 is a perspective view showing terraced cavity 6 formed within ceramic carrier 10. Terraced cavity 6 includes internal sidewalls 14. In the northeast corner of terraced cavity 6, support member 93 is included and includes terrace 16NE as a top surface. It should be understood that in the southeast corner of terraced cavity 6, a similar support member is included although not visible in the perspective view shown in FIG. 12. It can be seen that support member 93 and terrace 16NE do not extend along the entirety of any of sidewalls 14 which define terraced cavity 6. Reflective/transmissive member 44 rests partially on terrace 16NE, and is therefore angled with respect to top surface 12 and the base surface of terraced cavity 6 (not visible).

Figure 13:
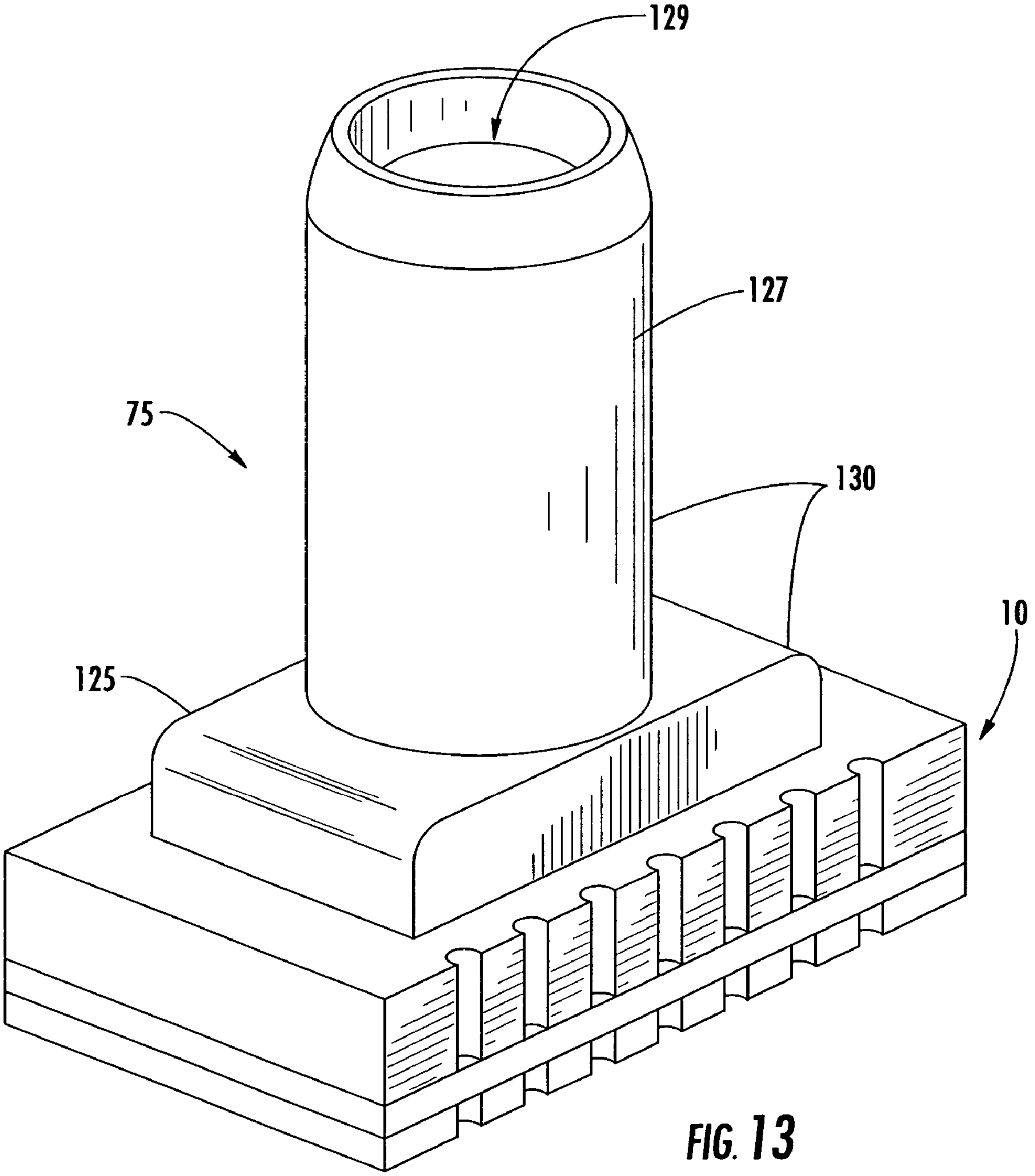
FIG. 13 is a perspective view showing the ceramic carrier coupled to an exemplary optical housing to form an OSA according to the present invention.

FIG. 13 is a perspective view showing multilayer ceramic carrier 10 joined to optical housing 75 to form optical subassembly 130. The configuration of optical housing 75 shown in FIG. 13 is intended to be exemplary only. Other configurations may be used alternatively. Optical housing 75 includes base portion 125 and barrel or cylindrical portion 127 which includes aperture 129. Aperture 129 extends axially through barrel section 127 and essentially forms a hollow core of barrel section 127. In an exemplary embodiment, optical housing 75 may be formed of plastic. Plastics such as Ultem 1010, Ultem 1000, Topas 5013 or Topas 5713 may be used, but other conventional plastic materials may be used according to other exemplary embodiments. Aperture 129 formed within barrel portion 127 is preferably configured to receive an optical ferrule including an optical fiber or other optical transmission medium. The OSA 130 shown in FIG. 13 may be a TOSA (transmissive optical subassembly) or ROSA (receive optical subassembly). According to either exemplary embodiment, light propagated along an optical transmission medium retained axially within aperture 129 of barrel portion 127 is received by or emitted from an optical component disposed within multilayer ceramic carrier 10. Multilayer ceramic carrier 10 is as described above and includes a cavity such as the terraced cavity including optical components as described above. Optical housing 75 shown in FIG. 13, is exemplary only, and various configurations other than the cylindrical/barrel configuration shown, may be used to retain an optical transmission member to propagate light emitted by or directed to an optical element retained within ceramic carrier 10.

Optical housing 75 includes a ball lens therein and the ball lens may be formed as an integral portion of optical housing 75. The lens is used to focus light from an optical transmission medium onto a light receiving device or to focus light emitted from a VCSEL onto an optical transmission medium. As such, according to the exemplary embodiment in which optical housing 75 is formed of plastic and includes an integral lens, the plastic is chosen for maximum transmissivity at the wavelength of interest. According to other exemplary embodiments, optical housing 75 may be formed of other suitable materials such as suitable metals or glass. Also according to other exemplary embodiments, optical housing 75 may include the ball lens separately formed and secured within optical housing 75. In an exemplary embodiment, the separately formed ball lens may be formed of glass or other suitable lens materials. According to yet another exemplary embodiment, the optical housing may include the ball lens and barrel portion integrally formed of a plastic with the base portion formed of another material. This exemplary embodiment will be shown in FIG. 31. In the following figures, however, base portion and barrel portion of optical housing 75 will be shown as an integrally formed unit and referred to, collectively, as optical housing 75.

Figure 14:
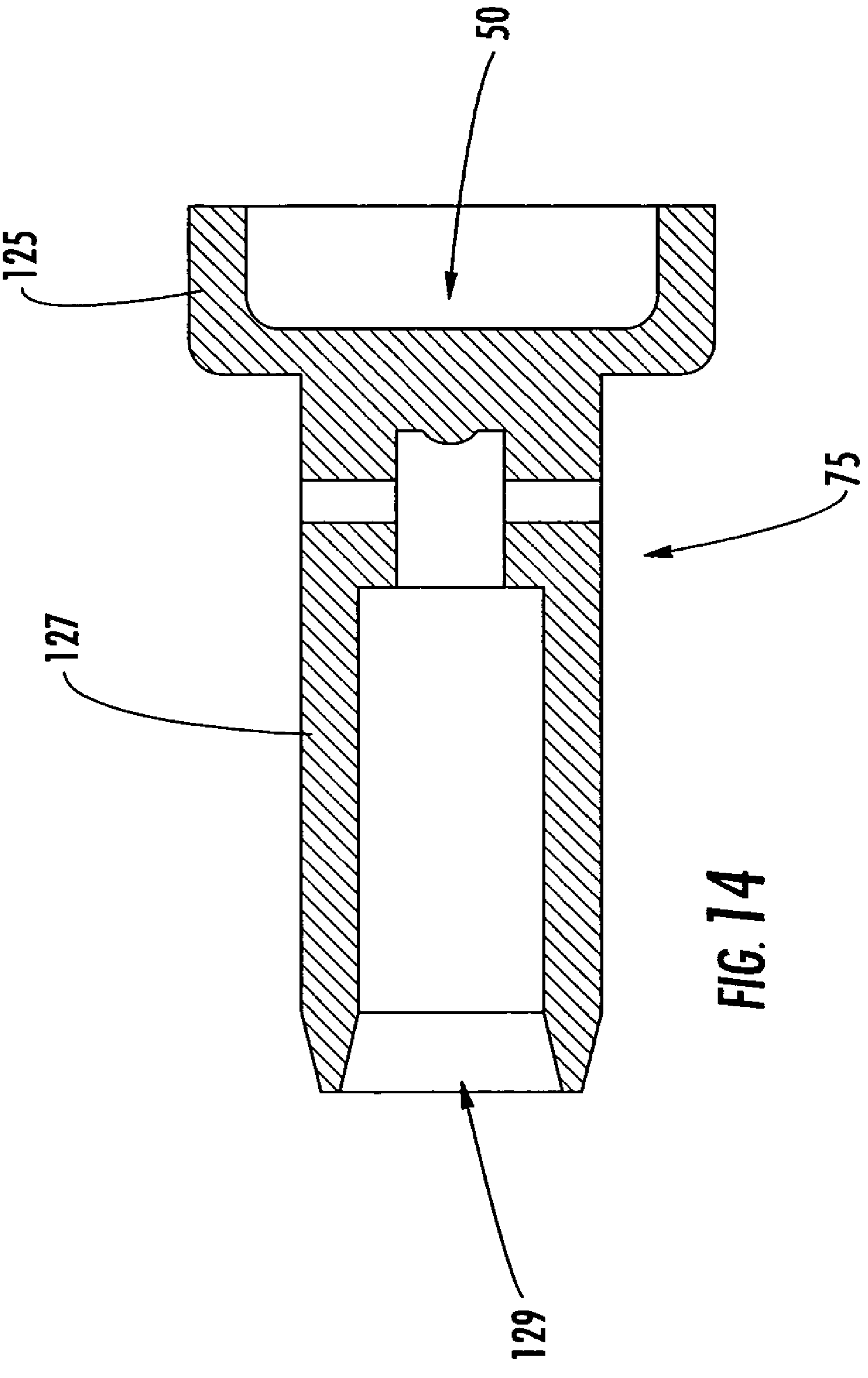
FIG. 14 is a cross-sectional view of an exemplary optical housing.

FIG. 14 is a schematic showing a cross-sectional view of optical housing 75. In FIG. 14, optical housing 75 includes integral ball lens 50, base portion 125, barrel portion 127, and aperture 129 which forms a hollow core of barrel section 127. Other configurations may be used according to other exemplary embodiments. According to other exemplary embodiments, base portion 125 may consist of a plurality of legs.

Optical housing 75 will preferably be joined to ceramic carrier 10 using epoxy, soldering, or a combination of the two. According to one exemplary embodiment, portions of optical housing 75 that are to be joined to ceramic carrier 10, may be metallized, then a material such as a dielectric or polymeric material preferably chosen to reduce the coefficient of thermal expansion (CTE) mismatch between optical housing 75 and ceramic carrier 10 may be introduced between ceramic carrier 10 and the metallized portion of optical housing 75.

Further methods and techniques for joining optical housing 75 to ceramic carrier 10 are described below. In each case, the method for permanently joining optical housing 75 to ceramic carrier 10 preferably includes the steps of positioning the components with respect to one another, and aligning the optical transmission medium secured within optical housing 75, to the optical source or optical detector contained within ceramic carrier 10, then permanently joining the components.

Figure 15:
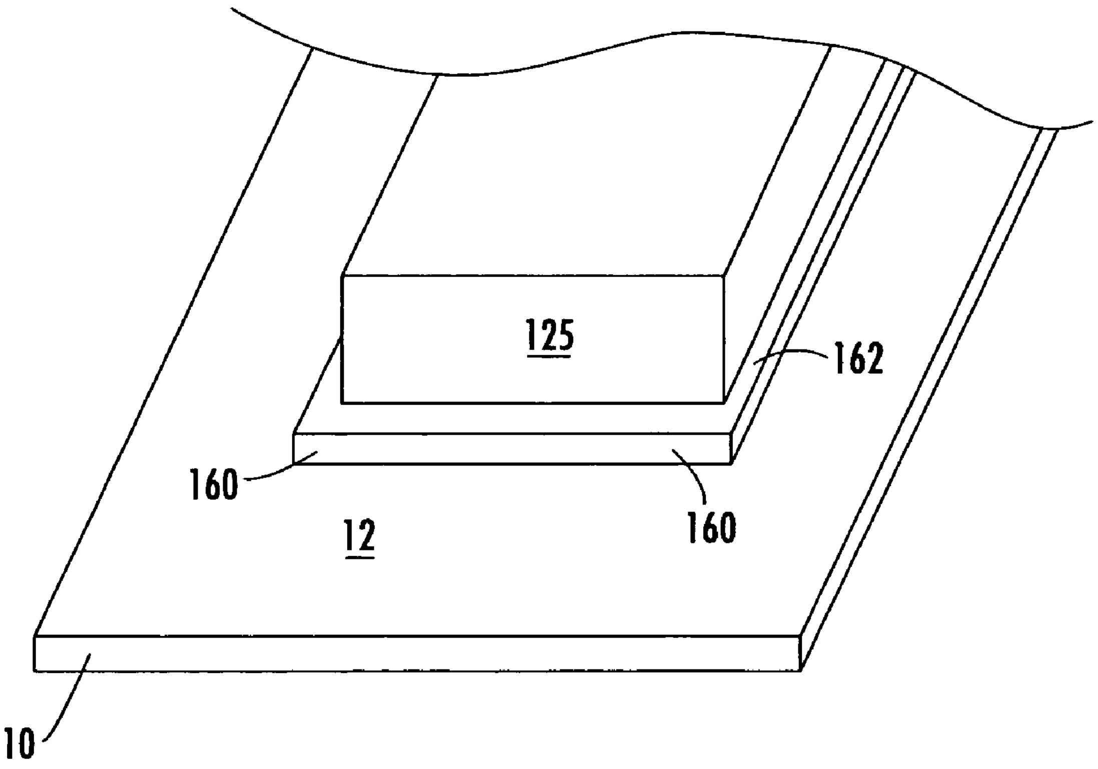
FIG. 15 is a perspective view showing a base portion of an optical housing coupled to a ceramic carrier.

FIG. 15 is a perspective view which shows base portion 125 (of the optical housing) being joined to top surface 12 of ceramic carrier 10. Base portion 125 includes ledge 160 including top surface 162. Ledge 160 extends peripherally around base section 125. According to other exemplary embodiments, ledge 160 may only extend partially around base section 125. For example, ledge 160 may appear only on opposed sides of base 125. Ledge 160 is preferably molded as an integral part of optical housing 75. In an exemplary embodiment, optical housing 75 including ledge 160 may be formed of plastic and by injection molding means. Ledge 160 extends along the bottom of base section 125 and is directly joined to top surface 12 as will be shown in FIG. 16.

Figure 16:
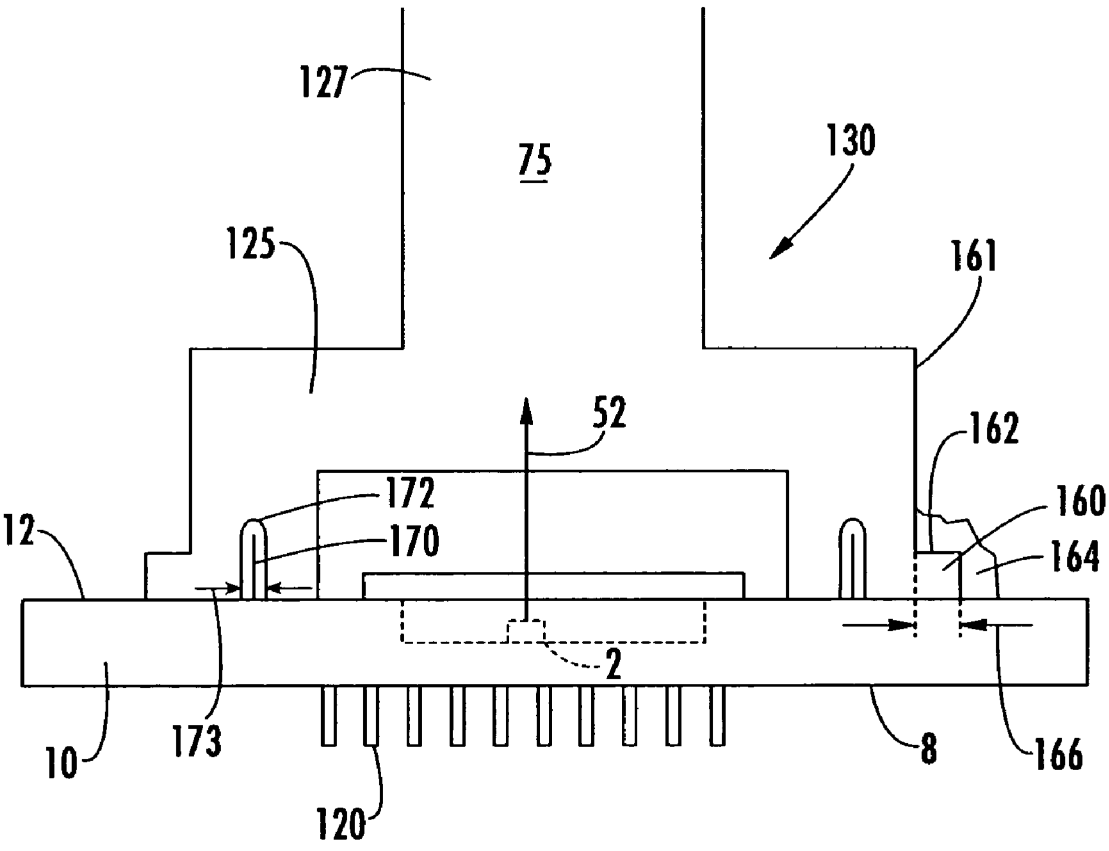
FIG. 16 is a cross-sectional view showing an exemplary arrangement for coupling the base of the optical housing to the ceramic carrier.

FIG. 16 is a cross-sectional view showing optical housing 75 mechanically coupled to top surface 12 of ceramic carrier 10 according to an exemplary embodiment. According to this exemplary embodiment, optical housing 75 may be formed of plastic. FIG. 16 shows two exemplary means for joining optical housing 75 to ceramic carrier 10—the peripheral ledge 160 shown and described in FIG. 15, and the pin 170/receptacle 172 feature. Fillet 164 of epoxy is used to couple optical housing 75 to surface 12 of ceramic carrier 10. In an exemplary embodiment, a UV-curable epoxy is used. According to other exemplary embodiments, visible light-curable, RF curable or thermally curable epoxies may be used. Fillet 164 of epoxy is preferably bonded to surface 12 of ceramic carrier 10, vertical surface 161, and extends overtop surface 162 of ledge 160. Fillet 164 forms a stronger bond with surface 12 than with vertical surface 161 of optical housing 75 formed of plastic, for example. This is due to the slightly porous nature of the ceramic carrier. Therefore, since the epoxy fillet 164 is bonded relatively securely to surface 12, and since the epoxy itself forms internally strong bonds, the portion of epoxy fillet 164 which lies above surface 162 of ledge 160 acts as a clamp to hold plastic optical housing 75 into place. This embodiment provides the advantage that the adhesive shear strength between epoxy fillet 164 and vertical surface 161 of optical housing 75 formed of plastic, is no longer the weak point in the bonding between the two components. Rather, because of the clamping nature of epoxy fillet 164, the shear strength of the epoxy material itself is preferably substituted as the weak point in the bond. The shear strength of the epoxy itself is advantageously greater than the adhesive shear strength between the epoxy material and vertical surface 161 of base portion 125 of optical housing 75. Therefore, the strength of the bond between the two components is preferably increased. In an exemplary embodiment, width 166 of ledge 160 may be on the order of 0.254mm, but other widths may be used alternatively. As will be shown below, this embodiment finds particular advantage in the various embodiments wherein OSA 130 is formed of the combination of ceramic carrier 10 and plastic optical housing 75 and is to be mounted on its side, with barrel section 127 of optical housing 75 ultimately extending horizontally and suspended over the mounting surface.

According to another exemplary embodiment, pins 170 may be formed to extend from surface 12 of ceramic carrier 10. Pins 170 may be formed of metal, ceramic, or other suitable materials. A plurality of pins may be formed on various locations of top surface 12. Corresponding to pins 170 formed on surface 12, are receptacles 172. Receptacles

172 extend inward from the surface of base section 125 that is to be joined to top surface 12. Receptacles 172 preferably include a that 173 which is considerably greater than the width of pins 170 such that, after optical housing 75 is brought into contact with ceramic carrier 10 and pins 170 are received within corresponding receptacles 172, the components may be aligned in the x, y direction to maximize the optical coupling efficiency, before the components are permanently joined. An epoxy may be introduced into receptacles 172. Next, the units are preferably aligned with respect to one another, and the epoxy cured to secure the components into position with respect to one another. According to the exemplary embodiment in which base section 125 surrounds the cavity or terraced cavity formed in ceramic carrier 10, the pin 170/receptacle 172 feature may be included at various locations where base section 125 contacts top surface 12. According to another exemplary embodiment, base section 125 may consist of a plurality of legs and one or more of the legs may include one or more receptacles 172 for receiving a corresponding pin 170 formed on surface 12.

FIG. 16 also shows a plurality of mounting pins 120 which extend orthogonally from bottom surface 8 of ceramic carrier 10. Mounting pins 120 preferably extend along the direction generally parallel to direction 52 along which VCSEL 2 emits light. Mounting pins 120 will be discussed further below.

Figure 17:
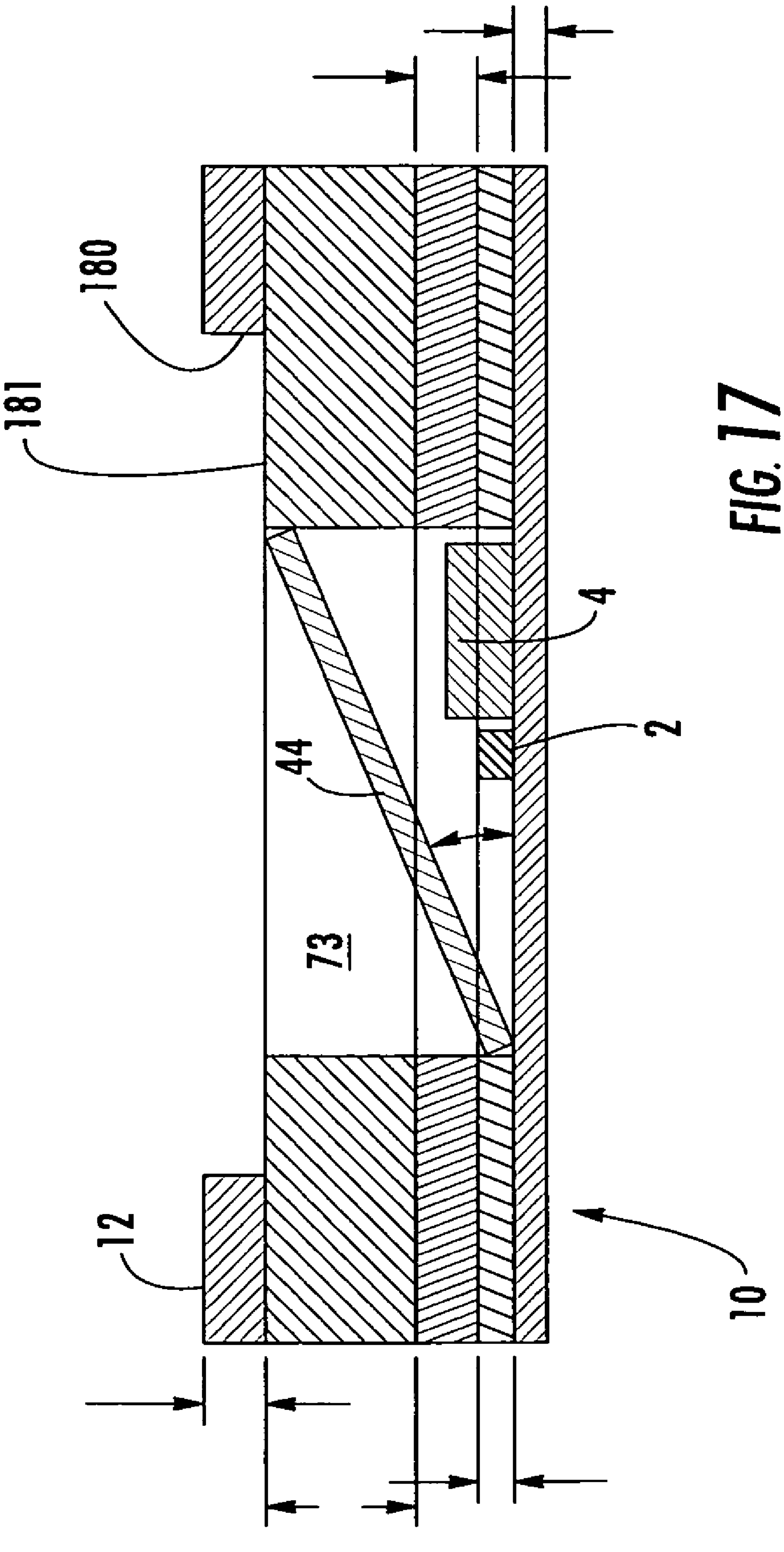
FIG. 17 is a cross-sectional view showing an exemplary ceramic carrier including a recessed portion.

FIG. 17 is a cross-sectional view of an exemplary ceramic carrier 10. Ceramic carrier 10 includes top surface 12 and recessed portion 180 which includes recessed surface 181. Recessed portion 180 may preferably be formed by including an appropriate cutout in the top ceramic layer or layers prior to assembly. According to this exemplary embodiment, the glass member which covers and which may hermetically seal cavity 73 such as glass cover 48 shown in FIGS. 10, 10A and 11, may be joined to recessed surface 181 within recessed portion 180. Similarly, base portion 125 of optical housing 75 including ledge 160 such as shown in FIG. 16, may also be joined to recessed surface 181 of recessed portion 180. Likewise, pins such as pins 170 shown in FIG. 16, may be formed to extend from recessed surface 181 according to various exemplary embodiments.

Figure 18:
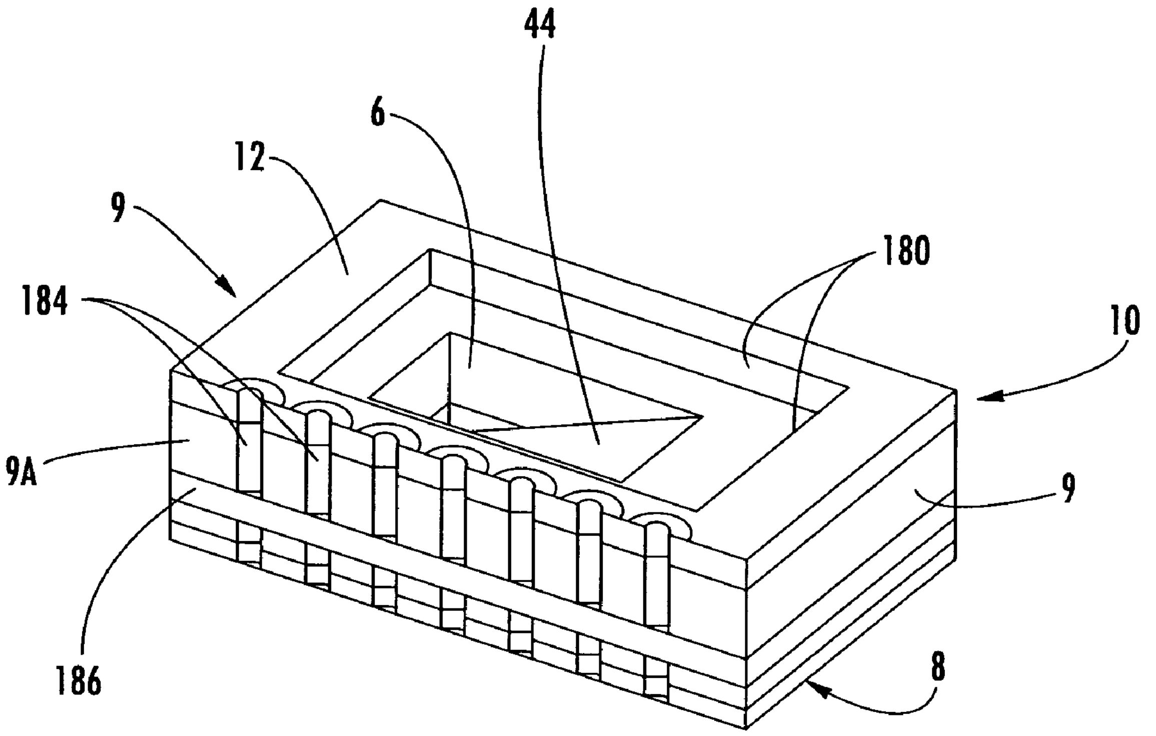
FIG. 18 is a perspective view of a ceramic carrier including a recessed top surface.

FIG. 18 is a perspective view of an exemplary ceramic carrier 10 including recessed portion 180, terraced cavity 6, angled reflective/transmissive member 44 disposed within terraced cavity 6, and external sidewalls 9. One of the external sidewalls, namely external sidewall 9A, is configured to be mounted along a mounting surface (not shown). External sidewall 9A includes notches 184 which extend along external sidewall 9A from top surface 12 to bottom surface 8. In the exemplary embodiment shown, notches 184 extend generally orthogonally with respect to top surface 12 and bottom surface 8, and generally parallel to the direction along which the VCSEL included within terraced cavity 6, emits light. In the exemplary embodiment shown, notches 184 are semi-cylindrical in shape, but other configurations may be used alternatively. Notches 184 may have conductive castellations formed therein, the conductive castellations capable of being joined to conductive components formed on a mounting surface to which external surface 9A will be joined, such as by soldering. Notches 184 are also capable of coupling electrical components and conductive traces formed within the various layers of multilayer ceramic carrier 10. It will be shown that external sidewall 9A is mounted along the mounting surface such that a VCSEL formed on base surface 17 (not shown) of terraced cavity 6 will preferably emit light in a direction generally parallel to the mounting surface and therefore perpendicular to top surface 12, bottom surface 8, and base surface 17. Notches 184 include stop 186 which produces discontinuous notches 184. In this manner, conductive material may extend only above or below stop 186, according to the illustrated embodiment. According to other exemplary embodiments, stop 186 may not be used.

Figure 19:
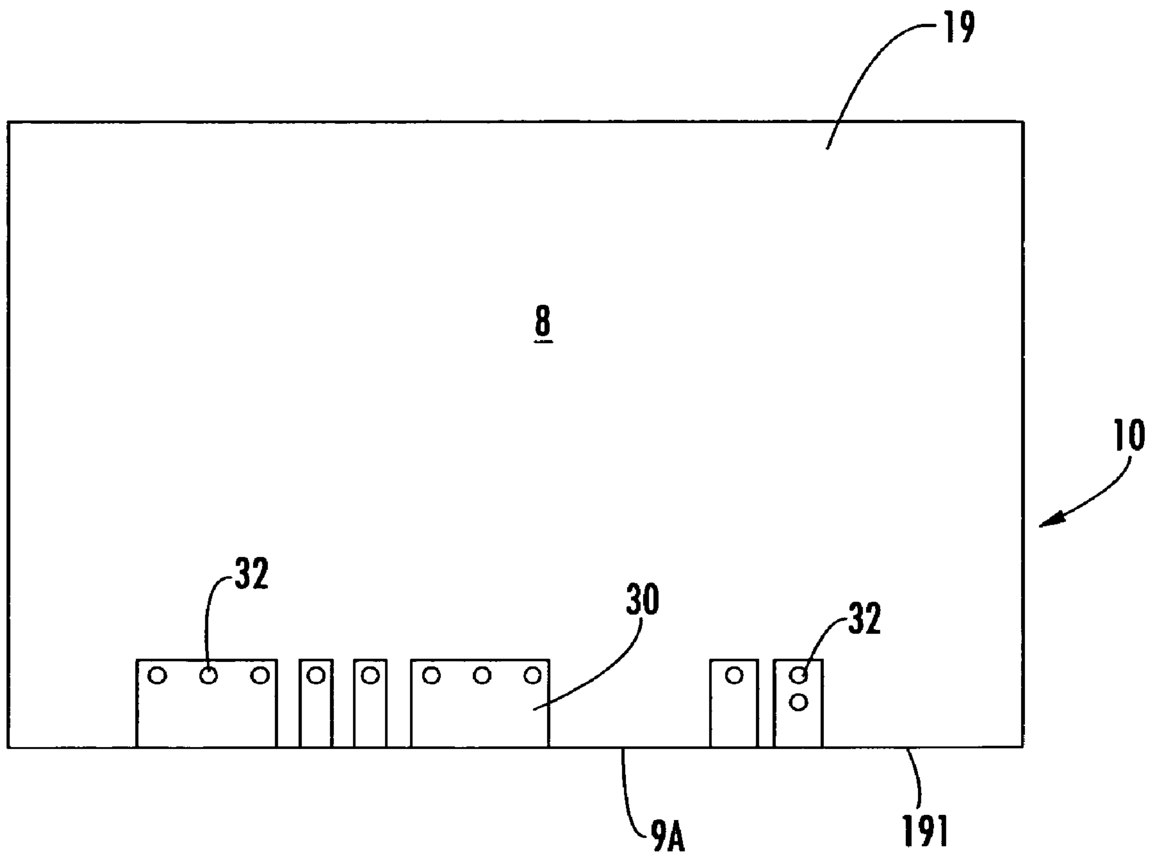
FIG. 19 is a plan view of an exemplary bottom surface of an exemplary ceramic carrier.

FIG. 19 is a plan view showing exemplary bottom surface 8 of exemplary ceramic carrier 10. Bottom surface 8 includes conductive traces 30 which are electrically coupled by vias 32 to other components (not shown) within ceramic carrier 10. In an exemplary embodiment, conductive traces 30 may be formed of metal such as gold or silver. The metal is preferably chosen for maximum conductivity and also in conjunction with the materials (e.g. HTCC or LTCC) and method used to form ceramic carrier 10. According to the exemplary embodiment shown in FIG. 19, conductive traces 30 are formed adjacent edge 191 which forms part of external sidewall 9A which is to be joined to a mounting surface, as will be shown below. This arrangement minimizes the electrical path a signal must traverse when external sidewall 9A is joined to the mounting surface along which the electrical signals travel. According to other exemplary embodiments, in which ceramic carrier 10 is mounted using other configurations, the conductive traces will be similarly clustered around the electrical connection point to minimize the distance and to minimize the routing of the electrical signal.

FIGS. 20, 21, 22 and 23 show various exemplary arrangements for mounting the optical subassembly consisting of the ceramic carrier and optical housing, onto a printed circuit board or other daughter board or mounting surface. In each of the exemplary embodiments, one of the external sidewalls of the ceramic carrier is conterminously mounted on the mounting surface. In each case, the pattern on the bottom surface of the ceramic carrier of the optical subassembly is preferably arranged so that the conductive traces formed on the bottom surface are formed adjacent the external sidewall which is mounted on the mounting surface. This ensures high-quality electrical connection with constant impedance characteristics such as required in high-frequency applications. The various exemplary embodiments shown and described provide for mounting the OSA on a mounting surface such that the base of the terraced cavity is generally perpendicular to the mounting surface on transmitter embodiments. In TOSA embodiments, the emitting surface of the VCSEL is mounted normal to the mounting surface and adapted to transmit an optical signal along an optical transmission medium configured parallel to the mounting surface. In receive embodiments, the absorbing surface of the vertically receiving photodetector is oriented normal to the mounting surface and therefore adapted to receive an optical signal propagated along a direction generally parallel to the mounting surface. In each case, the fiber launch direction is generally perpendicular to the mounting surface, and the fiber and optical ferrule are received and secured within an aperture formed in the optical housing and positioned generally parallel to the surface on which the OSA is mounted. According to the exemplary embodiments, the mounting surface may be a printed circuit board formed of suitable material, such as FR4, Duroid, Isoclad, Arlon, or other suitable conventional materials. According to other exemplary embodiments, the OSA may be mounted on a board other than the printed circuit board materials described above.

Figure 20:
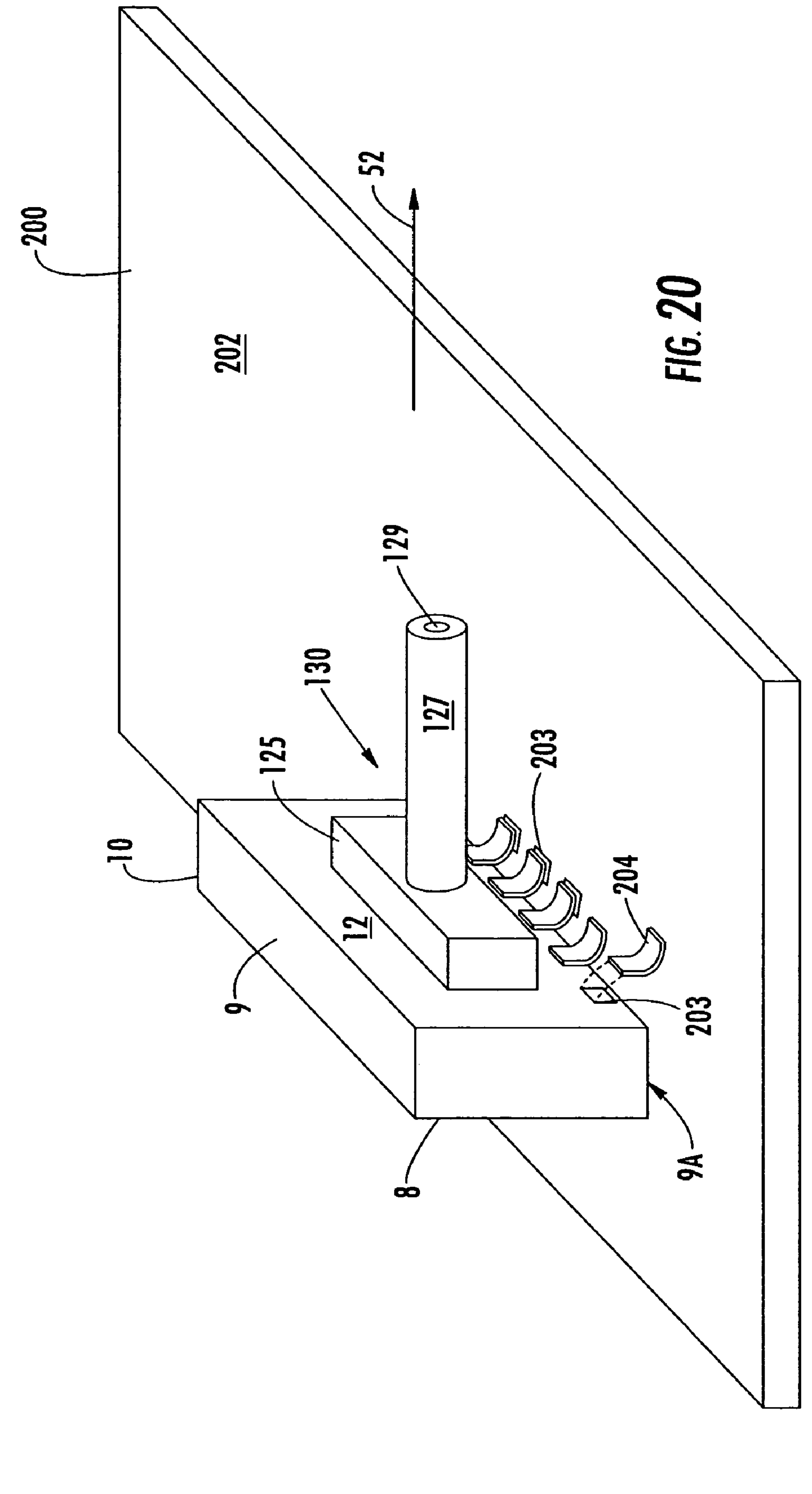
FIG. 20 is a perspective view showing an exemplary arrangement for mounting an OSA on a mounting surface.

FIG. 20 shows an exemplary method for mounting OSA 130 on a printed circuit board or other daughter board by joining ceramic carrier 10 to the mounting surface. In the exemplary embodiment, top surface 12 of ceramic carrier 10 is the surface of ceramic carrier 10 to which optical housing 75 is mounted and from which a cavity for retaining the optical element(s) extends. A VCSEL contained within ceramic carrier 10 emits light generally orthogonal to top surface 12. As mounted on surface 202 of printed circuit board 200, external sidewall 9A is conterminously joined to mounting surface 202. In this manner, top surface 12 and bottom surface 8 of ceramic carrier 10 now appear respectively as the right and left-hand sides of the mounted ceramic carrier 10, as shown in FIG. 20. For consistency, top surface 12 and bottom surface 8 of ceramic carrier 10 will continue to be referred to as "top surface 12" and "bottom surface 8" hereinafter.

In the exemplary embodiment shown in FIG. 20, J-leads 204 are used to mount optical subassembly 130 onto mounting surface 202. In an exemplary embodiment, J-leads 204 may be formed of metal and are preferably soldered or brazed to each of top surface 12 of ceramic carrier 10 and mounting surface 202 of printed circuit board 200. Conventional soldering methods may be used. Other methods may be used to join the J-leads to the ceramic carrier and the mounting surface. In an exemplary embodiment, J-Ieads to 204 may be brazed to pads 203 formed on each of top surface 12 of ceramic, carrier 10 and mounting surface 202. J-leads may be formed of rigid materials such as metals or ceramics. They may be formed of gold or gold-coated kovar in exemplary embodiments. The J-leads may be formed of other rigid materials in other exemplary embodiments. According to another exemplary embodiment, J-Ieads 204 may alternatively or additionally be used to join bottom surface 8 to mounting surface 202. According to one exemplary embodiment, J-leads 204 are formed of conductive material and additionally carry electrical signals between features of printed circuit board 200 and conductive traces formed on ceramic carrier 10. In another exemplary embodiment, J-leads 204 may be used only for mechanical support. In the exemplary embodiment shown in FIG. 20, an optical ferrule including an optical fiber may be received within aperture 129 of barrel section 127 of optical housing 75. The VCSEL (not shown) contained within ceramic carrier 10 emits light along direction 52, which is parallel to mounting surface 202.

Figure 21:
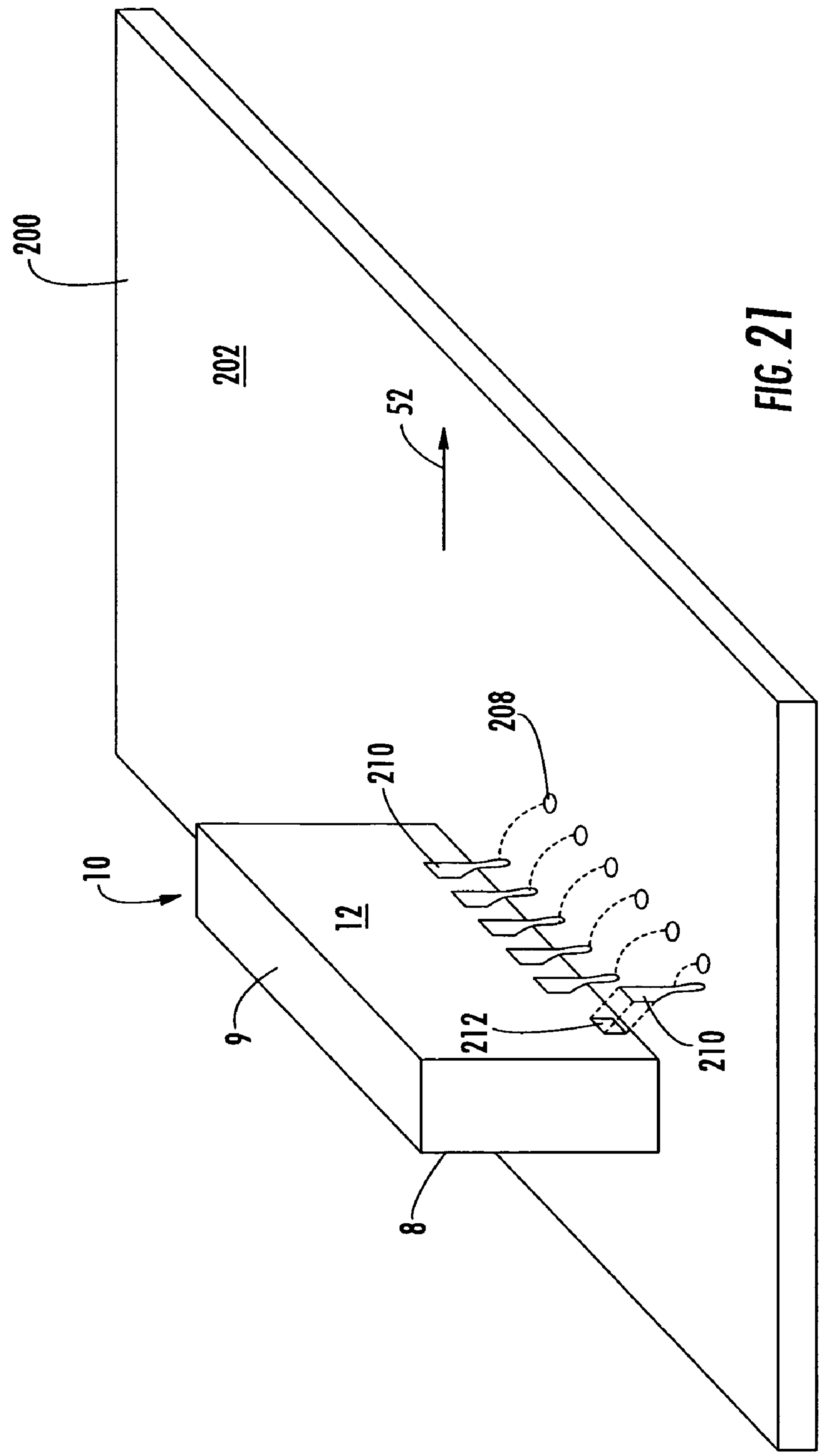
FIG. 21 is a perspective view showing another exemplary arrangement for mounting an OSA on a mounting surface.

Referring to FIG. 21, another exemplary embodiment for mounting ceramic carrier 10 onto mounting surface 202 of printed circuit board 200 is shown. For simplicity and clarity, the optical housing to which ceramic carrier 10 is joined, is not shown in FIG. 20. In the exemplary embodiment shown in FIG. 20, pins 210 may be joined to solder pads 212 formed on either or both of top surface 12, as shown in FIG. 20, or bottom surface 8 (not shown). In an exemplary embodiment, pins 210 may be formed of gold or gold coated kovar, but other materials may be used alternatively. Conventional methods may be used to solder or braze pins 210 onto solder pads 212. Corresponding holes 208 are formed in printed circuit board 200 to receive pins 210. After pins 210 are fixed to ceramic carrier 10 as above, ceramic carrier 10 is mounted onto printed circuit board 200 by inserting pins 210 into corresponding holes 208 formed in printed circuit board 200. After pins 210 are inserted into corresponding holes 208, conventional soldering techniques are preferably used to secure the ceramic carrier 10 into place. In an alternative embodiment (not shown), pins may be affixed to each of top surface 12 and bottom surface 8 of ceramic carrier 10 and inserted into corresponding holes formed on printed circuit board 200. This provides added stability. According to one exemplary embodiment, pins 210 may carry a signal between components of printed circuit board 200 and components of ceramic carrier 10, and according to another exemplary embodiment, pins 210 may be used only for mechanical stability purposes.

Figure 22:
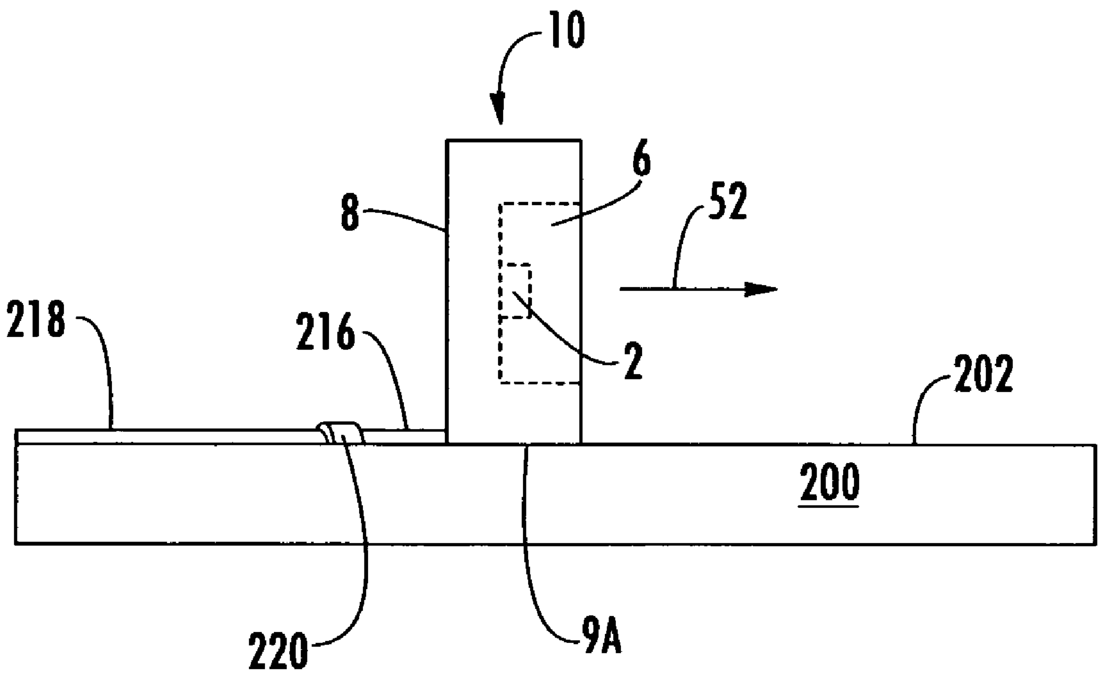
FIG. 22 is a side view showing yet another exemplary arrangement for mounting an OSA on a mounting surface.

FIG. 22 is a side view showing ceramic carrier 10, including mounting pins 216 which extend orthogonally from bottom surface 8. Mounting pins 216 extend along external sidewall 9A, which is mounted on surface 202 of printed circuit board 200. Pins 216 may be formed of metal, Kovar, or other suitable materials. The base of mounting pins 216 may be formed of Kovar or Alloy 42, but other materials may be used alternatively. Mounting pins 216 may preferably be plated with a layer of nickel or gold over the base portion. Pins 216 may provide mechanical support and may be soldered or epoxied onto surface 202. Pins 216 may also conduct an electrical signal according to various exemplary embodiments. According to such an exemplary embodiment, pins 216 may be electrically coupled to conductive traces 218 formed on surface 202 by means of solder bond 220. Conventional soldering techniques may be used. According to this exemplary embodiment, pins 216 may extend along and contact surface 202.

The J-leads and distinctive pins shown in FIGS. 20–22 are intended to be exemplary only. Other exemplary pin configurations may be used to join the ceramic carrier to mounting surface 202, such that the vertically emitting or receiving optoelectronic device within ceramic carrier 10, configured to receive or emit light along a direction parallel to mounting surface 202.

Figure 23:
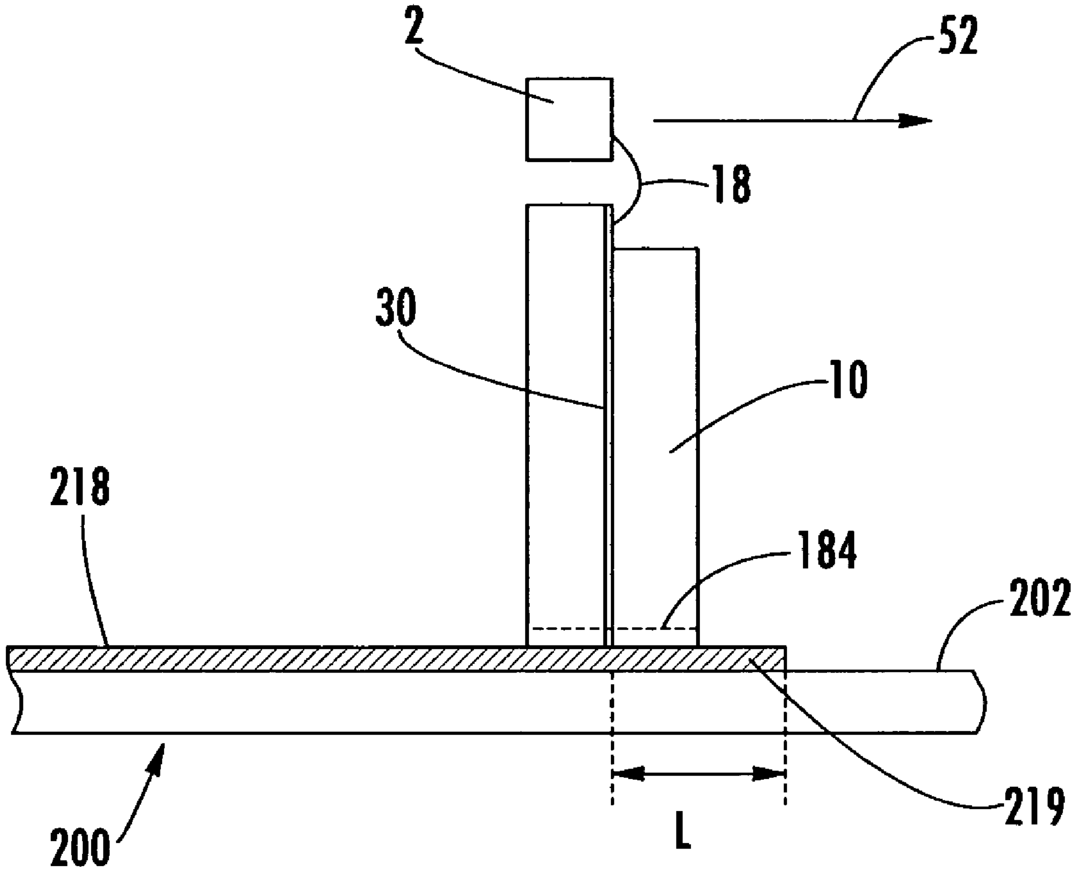
FIG. 23 is a partial side view showing another exemplary arrangement for mounting an OSA on a mounting surface.

FIG. 23 shows an expanded portion of ceramic carrier 10 joined to mounting surface 202 of printed circuit board 200. Conductive trace 30 extends between layers of the multilayer ceramic carrier 10 and is wire bonded to VCSEL 2 by means of wire bond 18. VCSEL 2 emits a light along direction 52, which is parallel to surface 202. Ceramic carrier 10 includes a plurality of notches 184 indicated by the dashed lines. Ceramic carrier 10 is joined to surface 202, such that the castellations formed within notches 184 are contacted to conductive trace 218 by soldering or other means. Conductive trace 218 is formed on surface 202. In this manner, the electrical signal path is preferably minimized and inductance is controlled. An electrical signal propagating from conductive trace 218 to VCSEL 2 desirably travels along the shortest electrical path. In order to preferably minimize the impedance mismatch of the electrical signal and to minimize loss due to signal reflection, microwave stub portion 219 of conductive trace 218 may be eliminated such that distance L of microwave stub 219 is zero. According to another exemplary embodiment, microwave stub 219 may be retained to tune the impedance. To ensure that microwave stub 219 is avoided, a stop, such as stop 186 shown in FIG. 18, may be used to ensure that the electrical signal path does not extend past the point where conductive trace 218 intersects conductive trace 30.

It should be emphasized that each of the embodiments shown and discussed in FIGS. 20–23 apply equally to mounting a receive optical subassembly including a vertically receiving optical element such as a conventional photodetector, onto a mounting surface to receive light propagated along an optical fiber held parallel to the mounting surface.

Figure 24:
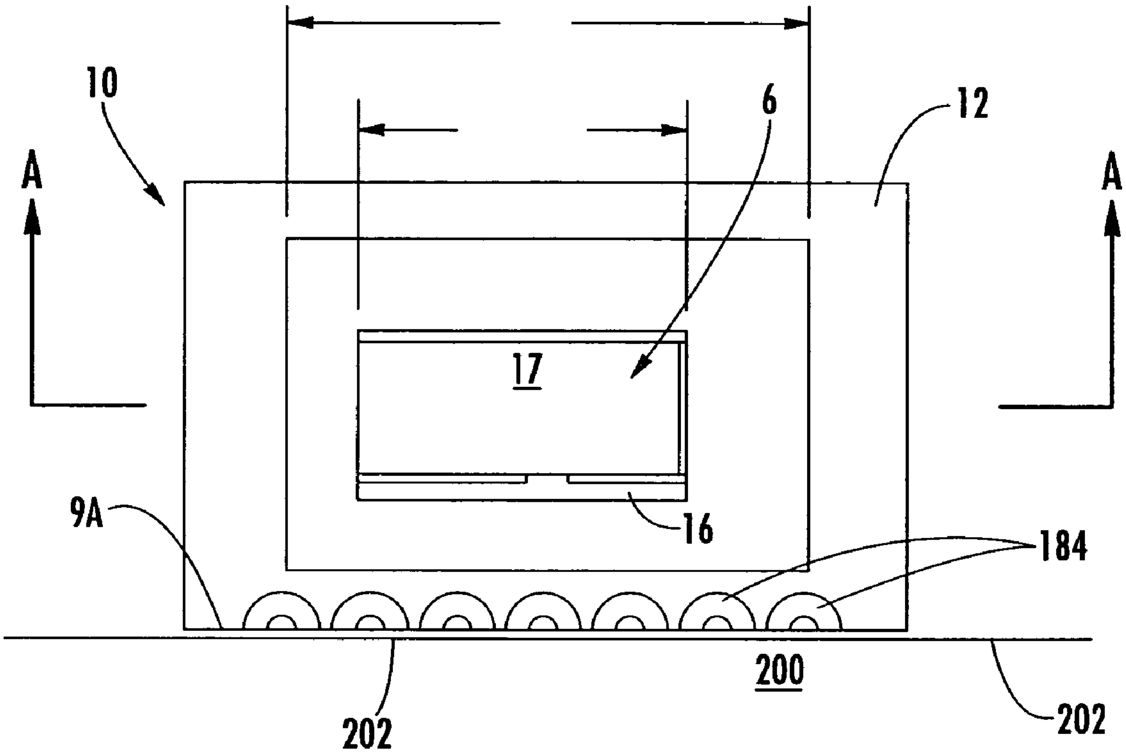
FIG. 24 is a plan view showing an exemplary OSA mounted on a mounting surface.

FIG. 24 is a front view showing ceramic carrier 10 mounted on mounting surface 202 of printed circuit board 200. Ceramic carrier 10 includes terraced cavity 6 and base surface 17, preferably perpendicular to mounting surface 202. Ceramic carrier 10 includes notches 184 formed along external sidewall 9A, which is mounted on mounting surface 202. Notches 184 are semi-circular in the exemplary embodiment shown and may be filled with conductive material to form castellations and conduct electrical signals, such as shown in FIG. 23.

Figure 25:
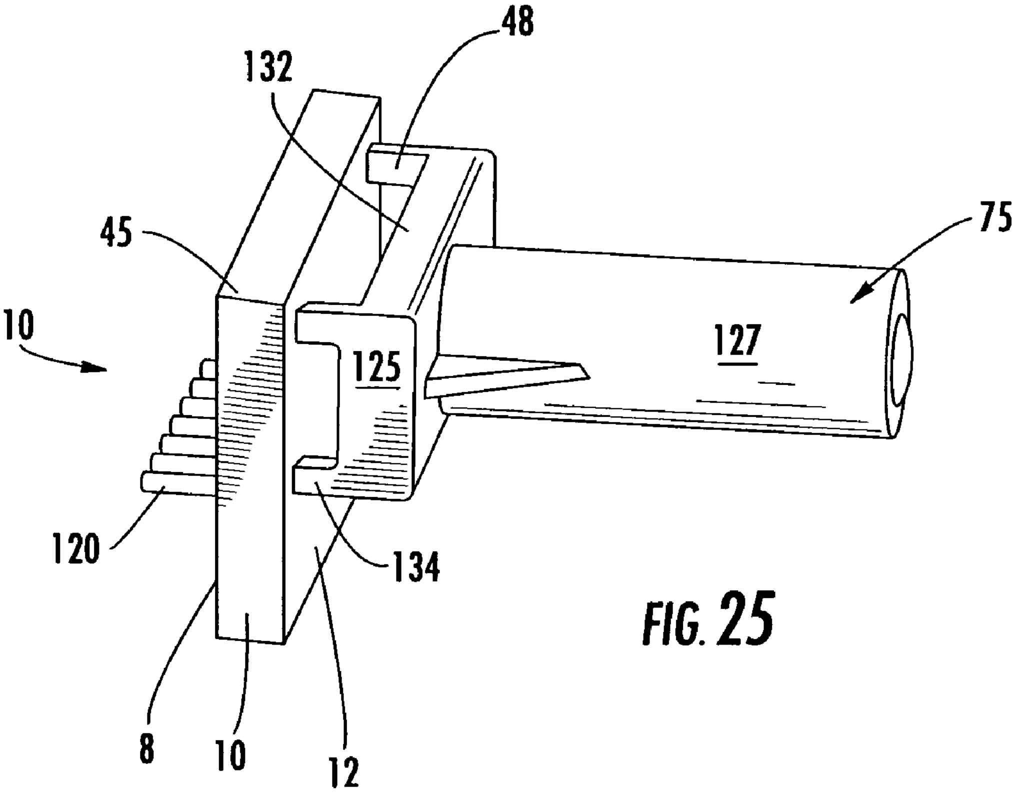
FIG. 25 is a perspective view of an exemplary OSA including a plastic housing, ceramic carrier, and mounting pins.

FIG. 25 is a perspective view showing another exemplary embodiment and another aspect of the present invention. FIG. 25 shows optical subassembly 130, including optical housing 75. Optical housing 75 includes base section 125, which includes four legs 134. In this embodiment, once optical housing 75 is joined to top surface 12 of ceramic carrier 10, an open space 132 exists between portions of optical housing 75 and ceramic carrier 10, even with cover glass 48 in position on top surface 12.

FIG. 25 also shows a row of mounting pins 120, that extend orthogonally from bottom surface 8 of ceramic carrier 10 and enable OSA 130 to be mounted adjacent an edge of a printed circuit board or other mounting board. As such, mounting pins 120 are generally parallel to the fiber launch direction and the direction along which a VCSEL formed within ceramic carrier 10 emits light. Mounting pins 120 are orthogonal to the emitting surface of a VCSEL or orthogonal to the receiving surface of a vertically receiving device, according to the embodiment in which OSA 130 is a ROSA. Although mounting pins 120 extend substantially perpendicularly from bottom surface 8 in the exemplary embodiment shown, other arrangements may be used alternatively. In the exemplary embodiment shown, the linear array of mounting pins 120 is disposed generally centrally within bottom surface 8. The exemplary row of mounting pins 120 may be formed to extend from bottom surface 8 at any of various locations.

Mounting pins 120 may be electrically conductive in an exemplary embodiment and may be electrically coupled to the optical element and other optoelectronic components contained within ceramic carrier 10. Bottom surface 8 may include conductive traces formed thereon and which extend to conductive mounting pins 120. According to the embodiment in which mounting pins 120 are conductive, the base of conductive mounting pins 120 may be formed of Kovar or Alloy 42, but other materials may be used alternatively. The conductive pins may each be plated with a layer of nickel and a layer of gold over the base portion. It will be seen that the linear array of mounting pins 120 will be joined to the surface of a printed circuit board, along the edge of the printed circuit board. Mounting pins 120 are joined to a surface of a printed circuit board such that optical subassembly 130 is mounted adjacent the edge of the printed circuit board, such that portions of optical subassembly 130 extend above the printed circuit board surface and portions of optical subassembly 130 extend below the surface of the printed circuit board. Since optical subassembly 130 is not mounted directly over the printed circuit board and at the expense of vertical module space, it can be of increased size and can advantageously include additional components within ceramic carrier 10. The VCSEL or vertically receiving optical device is preferably oriented to emit or receive light which travels along a fiber launch direction which is parallel to the printed circuit board. According to the embodiment in which mounting pins 120 are. conductive, they may advantageously be coupled to corresponding conductive pads which are formed along the edge of the printed circuit board and which are electrically coupled to conductive traces and devices formed on the printed circuit board.

Other arrangements of mounting pins 120 may be used alternatively. According to one exemplary embodiment, mounting pins 120 may be formed in a linear array but spaced irregularly. According to another exemplary embodiment, two parallel rows of mounting pins 120 may be used. According to this exemplary embodiment, the pair of rows of mounting pins formed on the OSA 130 may be joined to each of respective top and bottom surfaces of the printed circuit board.

Figure 26:
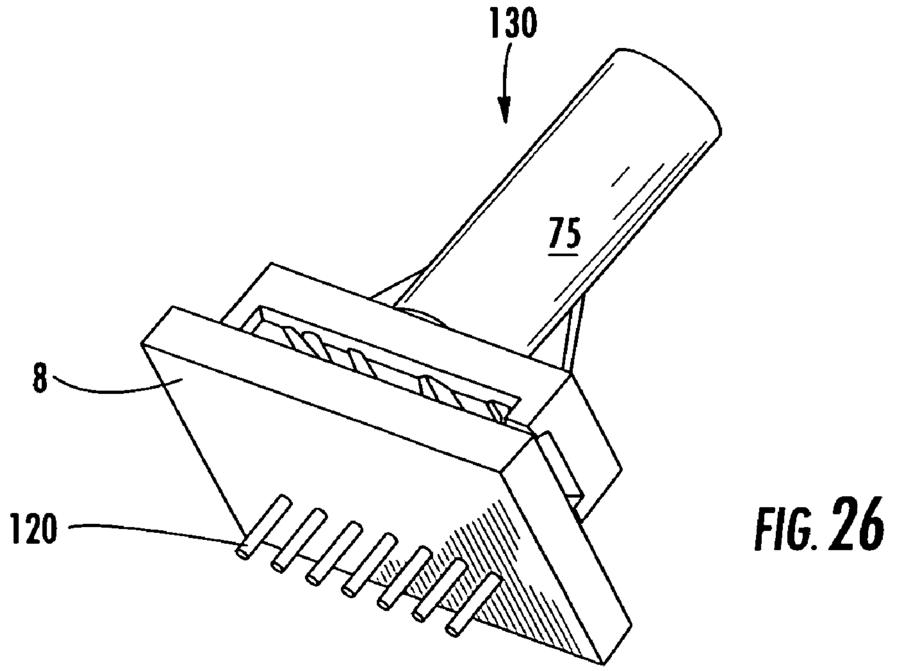
FIG. 26 is another perspective view of the exemplary optical subassembly shown in FIG. 25.

FIG. 26 is another perspective view of optical subassembly 130, which includes a linear array of mounting pins 120. According to yet another exemplary embodiment, the mounting pins 120 may be non-conductive. According to one exemplary embodiment, non-conductive pins may be interposed between conductive pins along a common row, such as depicted in FIGS. 25 and 26. Mounting pins 120 formed of conductive or non-conductive material are preferably used to mechanically couple OSA 130 and a printed circuit board.

In the exemplary embodiment in which mounting pins 120 are conductive, bottom surface 8 of ceramic carrier 10 may include a metal or conductive pattern formed thereon. The conductive material on ceramic carrier 10 may preferably be soldered to the printed circuit board at a 90° angle to effectuate the electrical connection. The dimensions and spacing of the patterned conductive material on the ceramic carrier are preferably limited only by the printing technique and not the electrical coupling technique. In this manner, a high density of electrical connection may be achieved.

Figure 27:
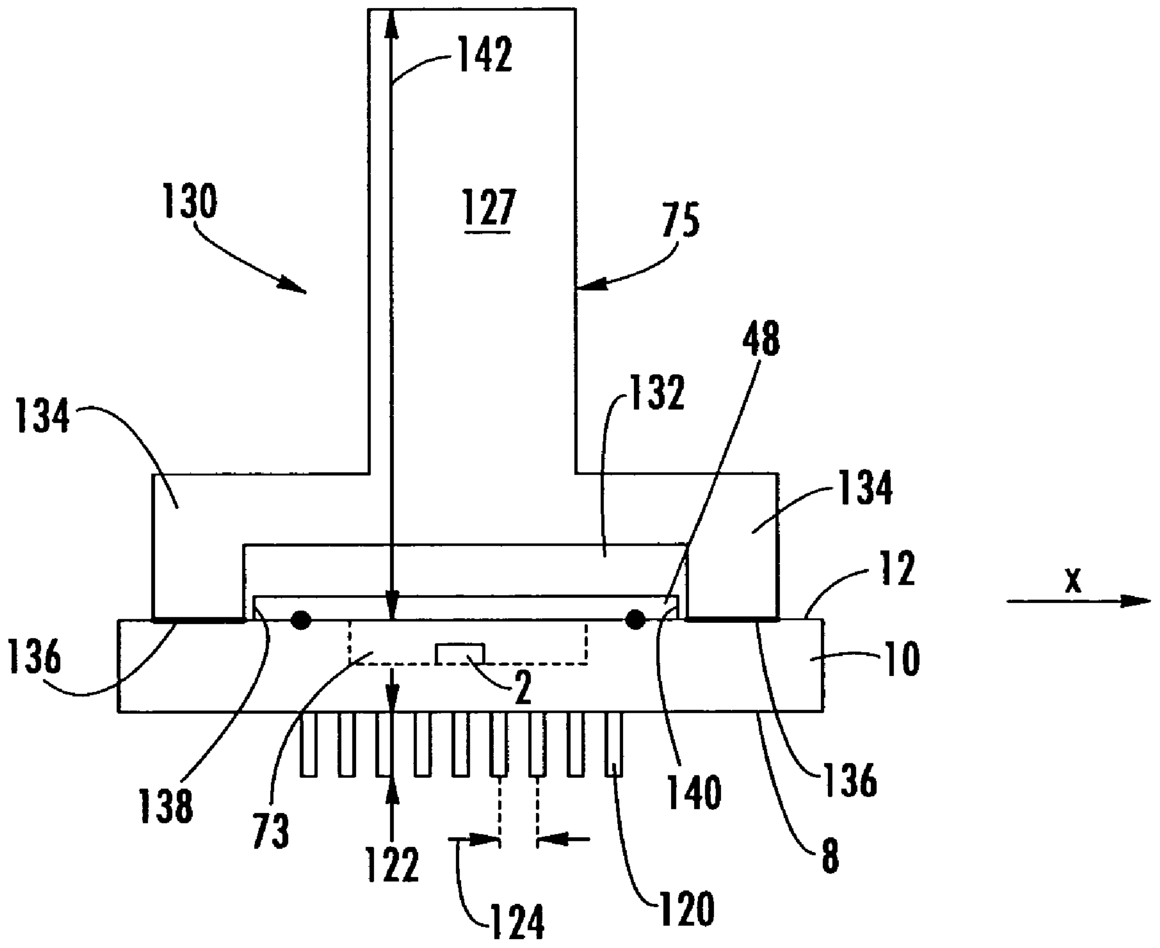
FIG. 27 is a perspective view showing an exemplary method for coupling the base of the optical housing to the ceramic carrier.

FIG. 27 is a side view of OSA 130, including optical housing 75 and ceramic carrier 10. A linear array of mounting pins 120 extends orthogonally from bottom surface 8. In the exemplary embodiment shown, mounting pins 120 may include length 122 of two millimeters, but other lengths may be used alternatively. According to an exemplary embodiment, mounting pins 120 may be arranged in a linear array of nine mounting pins 120 and may include a pitch 124 of 1.27 millimeters or 50 mils, according to exemplary embodiments, but various other pitches may be used alternatively. According to one exemplary embodiment, optical housing 75 may be formed of plastic and may include height 142, which may be on the order of 12.86 millimeters according to one exemplary embodiment, but various other heights 142 may be used according to various other exemplary embodiments.

An advantage of exemplary OSA 130 of the present invention, which includes mounting pins 120 and is therefore edge-mounted adjacent an edge of a printed circuit board, is that the entire OSA need not be positioned over the printed circuit board. In this manner, there are less space constraints and design restrictions, and the lateral dimensions of ceramic carrier 10 (the length and width of each of top surface 12 and bottom surface 8) may be relatively large, and the cavity or terraced cavity formed extending inwardly from top surface 12, may be correspondingly large enough to include additional semiconductor and electronic components besides the primary optoelectronic device. Additional components which may be included in the ceramic package of the OSA are resistors, monitor diodes and other photodetectors, capacitors, inductors, and laser diode drivers in the exemplary embodiment in which the OSA is a transmit optical subassembly. According to the exemplary embodiment in which the optical subassembly is a ROSA, transimpedance amplifiers, transimpedance limiting amplifiers, resistors, capacitors, inductors, and high-speed detectors may be among the components additionally included within the OSA. As above, edge-mounted OSA 130 may extend both above and below the printed circuit board or, according to another exemplary embodiment, mounting pins 120 may be arranged such that edge-mounted OSA 130 extends essentially only above, or essentially only below, the printed circuit board.

According to an exemplary embodiment, the lateral dimensions of each of opposed top surface 12 and bottom surface 8 may be at least 13×8 millimeters, and in an exemplary embodiment may be 13×8.5 millimeters. Other dimensions may be used alternatively. The distance between opposed surfaces 12 and 8, i.e., the height of ceramic carrier 10, may vary, and in an exemplary embodiment, may be 1.73 millimeters. Such dimensions are intended to be exemplary only and will vary depending on various applications and space concerns.

Still referring to FIG. 27, the method for joining optical carrier 75 to ceramic carrier 10, more particularly the alignment tolerance in joining the components, is advantageously improved because of the increased size of ceramic carrier 10, possible due to the fact that the optical subassembly is not mounted completely over the printed circuit board or other mounting surface. According to the method for joining the components, epoxy 136 is preferably introduced to the interface formed between legs 134 of optical housing 75 and top surface 12 of ceramic carrier 10. Various suitable UV-curable epoxies, visible light-curable epoxies, or RF-curable epoxies may be used. Legs 134 of optical housing 75 are brought into contact with top surface 12, such that optical housing 75 generally straddles glass cover 48. Optical housing 75 is aligned such that cylindrical portion 127 is generally positioned over cavity 73 which may be a terraced cavity, and centered over VCSEL 2, formed in cavity 73, according to an exemplary embodiment. FIG. 27 is a side view of the arrangement, and that each side of optical housing 75 includes multiple legs 134. That is, each of the two illustrated legs 134 represents a set of legs extending perpendicularly to the plane of the figure. Before optical housing 75 is permanently joined to ceramic carrier 10, the optical elements in ceramic carrier 10 and optical housing 4 will preferably be aligned to one another.

The alignment process may involve aligning a VCSEL or a vertically receiving optical element to an optical fiber secured within cylindrical portion 127 of optical housing 75. During the alignment process, the components may be moved freely relative to one another along the direction perpendicular to the plane of the page. Along the x-direction, as shown in FIG. 27, legs 134 of optical housing 75 and glass cover 48 are sized such that a total spacing of 500 microns may be achieved between the inside of legs 134 and outer edges 138, 140 of glass cover 48. This preferably provides an alignment tolerance in the x-direction as well as the y-direction. After acceptable assignment is achieved, UV radiation, or visible light is used to cure epoxy 136 and fix optical housing 75 in position with respect to ceramic carrier 10. The joined units include open space 132 between the components. The aligned components will include the optical fiber contained in cylindrical portion 127, being aligned with VCSEL 2 or the vertically receiving optical element disposed in cavity 73. Cylindrical portion 127 and optical housing 75 may essentially be centered with respect to ceramic carrier 10, or they may be off center according to various exemplary embodiments. After the units are fixed into position with respect to one another, a permanent epoxy, for example, a thermally-curable epoxy, is preferably used to permanently join the components together. Various suitable thermally curable epoxies may be used. According to another exemplary embodiment, various other permanent epoxies, such as UV-curable epoxies, RF curable epoxies, and visible light-curable epoxies may be used. The permanent epoxy such as permanent epoxy 154 shown in FIG. 28 may seal open space 132. Optical subassembly 130, including mounting pins 120 which extend from bottom surface 8, is now ready to be mechanically coupled to a printed circuit board.

Figure 28:
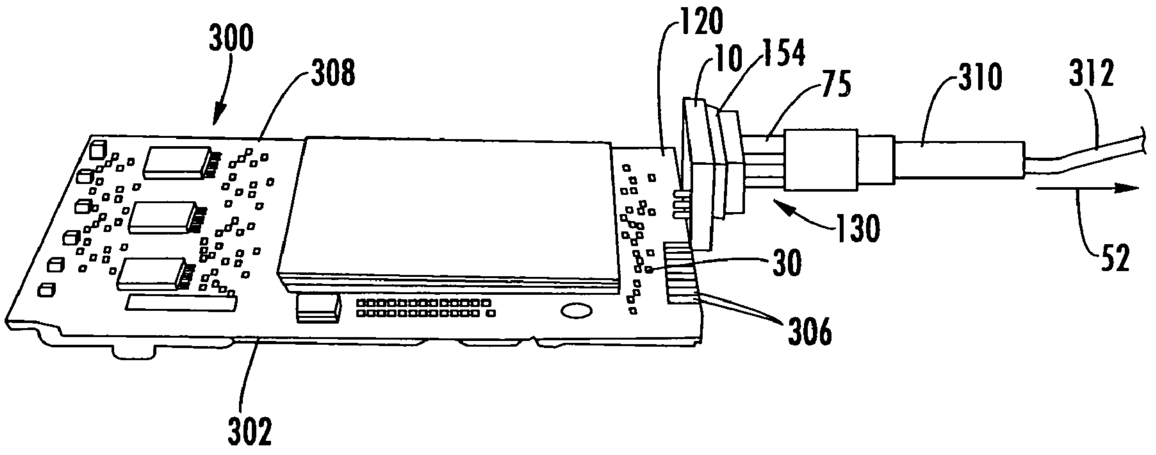
FIG. 28 is a perspective view showing an exemplary OSA mounted to the edge of a printed circuit board.

FIG. 28 is a perspective view showing optical subassembly 130 coupled to edge 304 of printed circuit board 300. Optical subassembly 130 is mounted to printed circuit board 300, such that light emitted by a VCSEL included within ceramic carrier 10 of optical subassembly 130 is emitted along direction 52, parallel to the direction of optical fiber 312 and substantially parallel to surface 302 of printed circuit board 300 and the circuitry formed thereon. According to either the TOSA or ROSA embodiment, the vertically emitting or vertically receiving optical element preferably includes an emitting or receiving surface mounted parallel to bottom surface 8 and normal to surface 302. Printed circuit board 300 may be a conventional printed circuit board formed of suitable materials, such-as described above. Permanent epoxy 154 joins the components of OSA 130.

Printed circuit board 300 preferably includes top surface 302 and edge 304 to which OSA 130 is joined. Cover 310 may be a jacket, shrink tubing or other means used to secure optical fiber 312 to OSA 130. Optical fiber 312 includes an optical fiber within an optical ferrule, which is secured within an aperture of optical housing 75. OSA 130 includes a row of mounting pins 120, which are conductive in the exemplary embodiment and are joined to corresponding conductive pads 306, which are formed on top surface 302 of printed circuit board 300 and extend inwardly from edge 304. In the exemplary embodiment shown in FIG. 28, conductive pads 306 are substantially orthogonal to edge 304 but may be oriented differently. Conductive pads 306 are electrically coupled to conductive traces and other optoelectronic elements on printed circuit board 300. Conductive mounting pins 120 of optical subassembly optoelectronic 130 are joined to corresponding leads 306 of printed circuit board 300, by soldering in an exemplary embodiment. Other methods for electrically coupling conductive mounting pins 120 to corresponding leads 306 may be used alternatively. OSA 130 is mounted to printed circuit board 300, such that it is disposed adjacent edge 304 of printed circuit board 300. It should be pointed out that, as mounted, optical subassembly 130 includes portions which extend both above and below printed circuit board 300 in the exemplary embodiment shown in FIG. 28.

Figure 29:
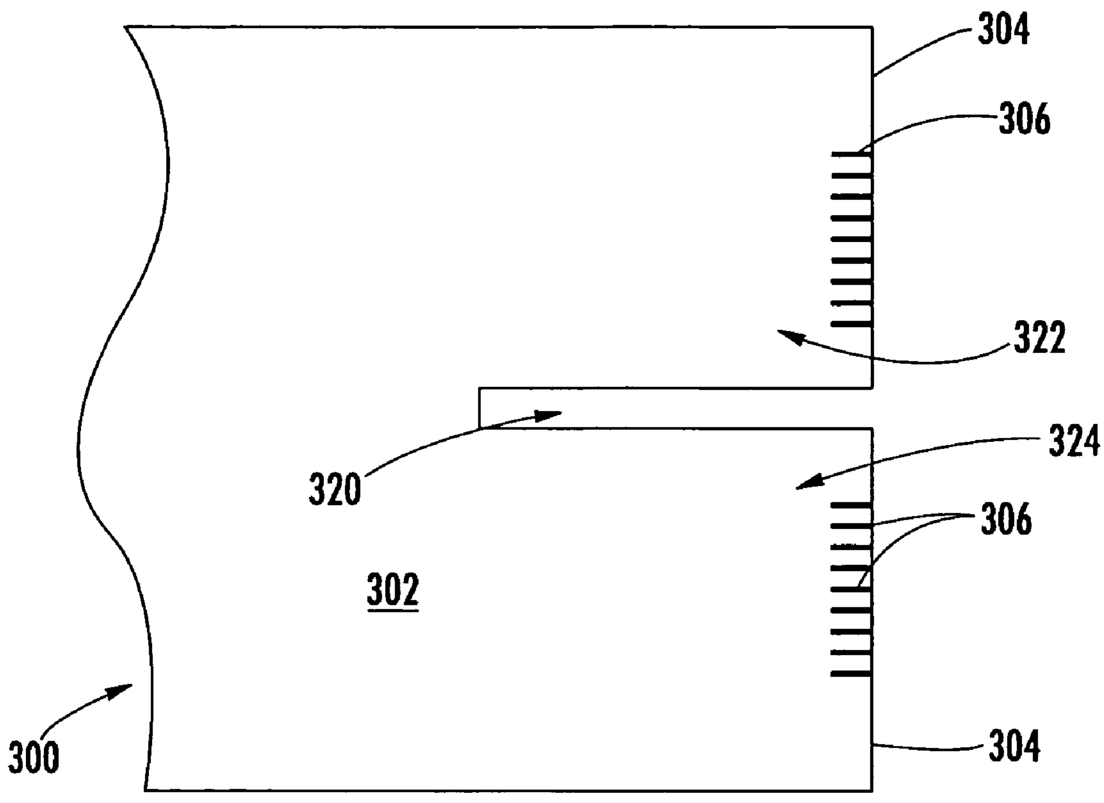
FIG. 29 is a plan view of an exemplary printed circuit board according to the present invention.

FIG. 29 is a plan view showing exemplary printed circuit board 300. Printed circuit board 300 includes conductive pads 306 which terminate at edge 304 and are electrically connected to electrical circuitry on printed circuit board 300 (not shown). Conductive pads 306 are formed to correspond to conductive mounting pins formed on an OSA, such as conductive mounting pins 120 shown in FIG. 28. In the exemplary embodiment shown, printed circuit board 300 includes notch 320 extending inwardly from edge 304. According to other exemplary embodiments, notch 320 may not be used. According to one exemplary embodiment, a separate optical subassembly may be joined to each of portion 322 and portion 324 on opposed sides of notch 320 of printed circuit board 300. For example, a ROSA may be coupled to portion 322, and a TOSA may be coupled to portion 324, or vice versa. This is achievable, as a septum or metal shield may be received within notch 320 to electronically shield the TOSA from the ROSA and to prevent cross-talk between the components. According to an exemplary embodiment, the septum may be a part of the enclosure in which printed circuit board 300 is installed.

According to another aspect of the present invention, the ceramic carrier of the optical subassembly may be mounted onto a mounting surface such as the surface of a printed circuit board, using a solderless mounting technique. This technique may include various relief features formed on or attached to the printed circuit or other board, to be received in corresponding openings formed in the ceramic carrier.

Figure 30:
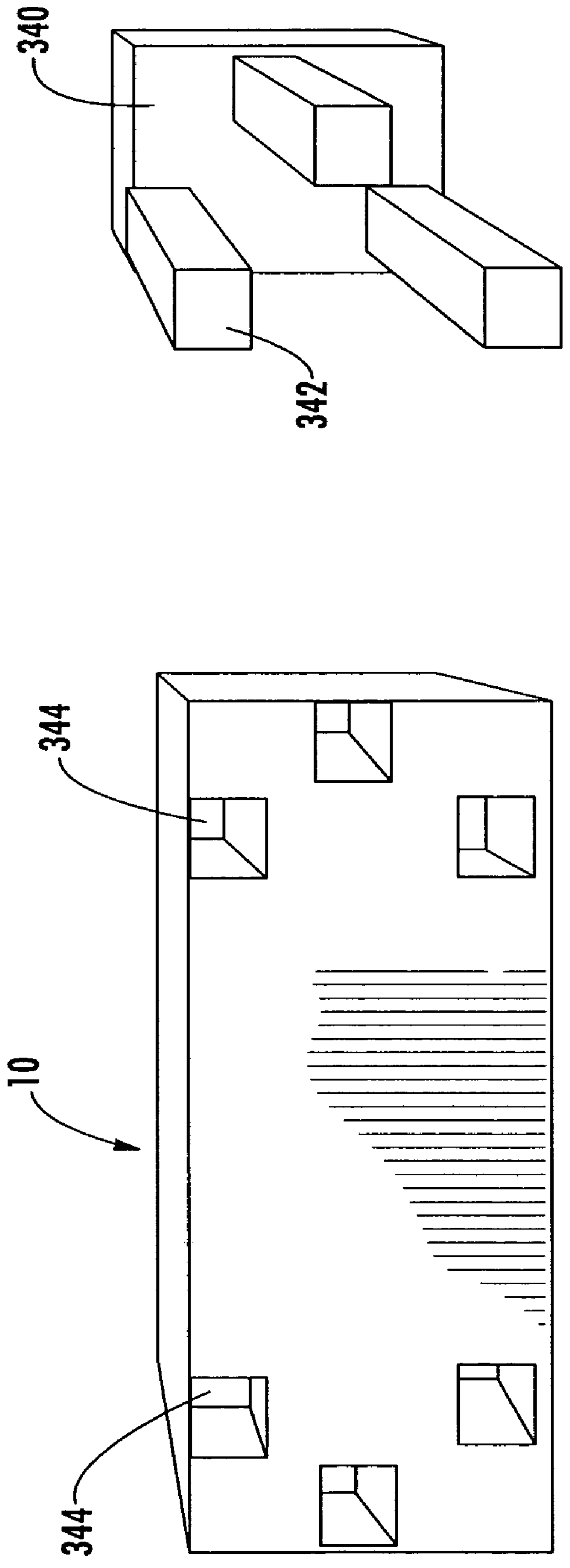
FIG. 30 is a perspective view showing exemplary relief features for mounting the ceramic carrier on a mounting surface using relief features.

Referring to FIG. 30, bracket 340 may be securely coupled to a printed circuit board or other mounting surface, using conventional means such that legs 342 extend orthogonally from the printed circuit board. According to an exemplary embodiment, the bracket, including pins 342, may be formed of metal, but other rigid and mechanically stable materials may be used in other embodiments. FIG. 30 also shows exemplary ceramic carrier 10 which includes holes 344. According to the exemplary embodiment shown, two brackets 340 may be secured on a surface so as to secure ceramic carrier 10 into position. It should be understood that other bracket arrangements may be used alternatively. Holes 344 may be produced by punching appropriate holes through the various layers of ceramic tape before they are joined together to form the multi-layer ceramic carrier, or they may be formed by tooling after ceramic carrier 10 has been formed. Other methods for forming holes 344 may be used alternatively. Holes 344 are shaped and configured to receive a corresponding pin 342 of bracket 340. It can be seen that exemplary holes 344 are tapered. In this manner, holes 344 accommodate generally orthogonal pins 342 to be slid into holes 344 at the wider portion of holes 344. Then, as ceramic carrier 10 is slid into place over bracket 340, pins 342 become tightly nested within holes 344.

It should be understood that the bracket 340/holes 344 embodiment shown in FIG. 30 is intended to be exemplary only. Other protruding relief features and corresponding openings for receiving the relief features may be used according to other exemplary embodiments. For example, pins which are generally round, elliptical or other shapes in cross-section may be used. According to another exemplary embodiment, after the protruding relief features are introduced in corresponding openings in which they are nested, additional techniques may be used to secure the relief features into position. For example, conventional brazing or soldering techniques may be used, or epoxy may be used to secure the components.

Figure 31:
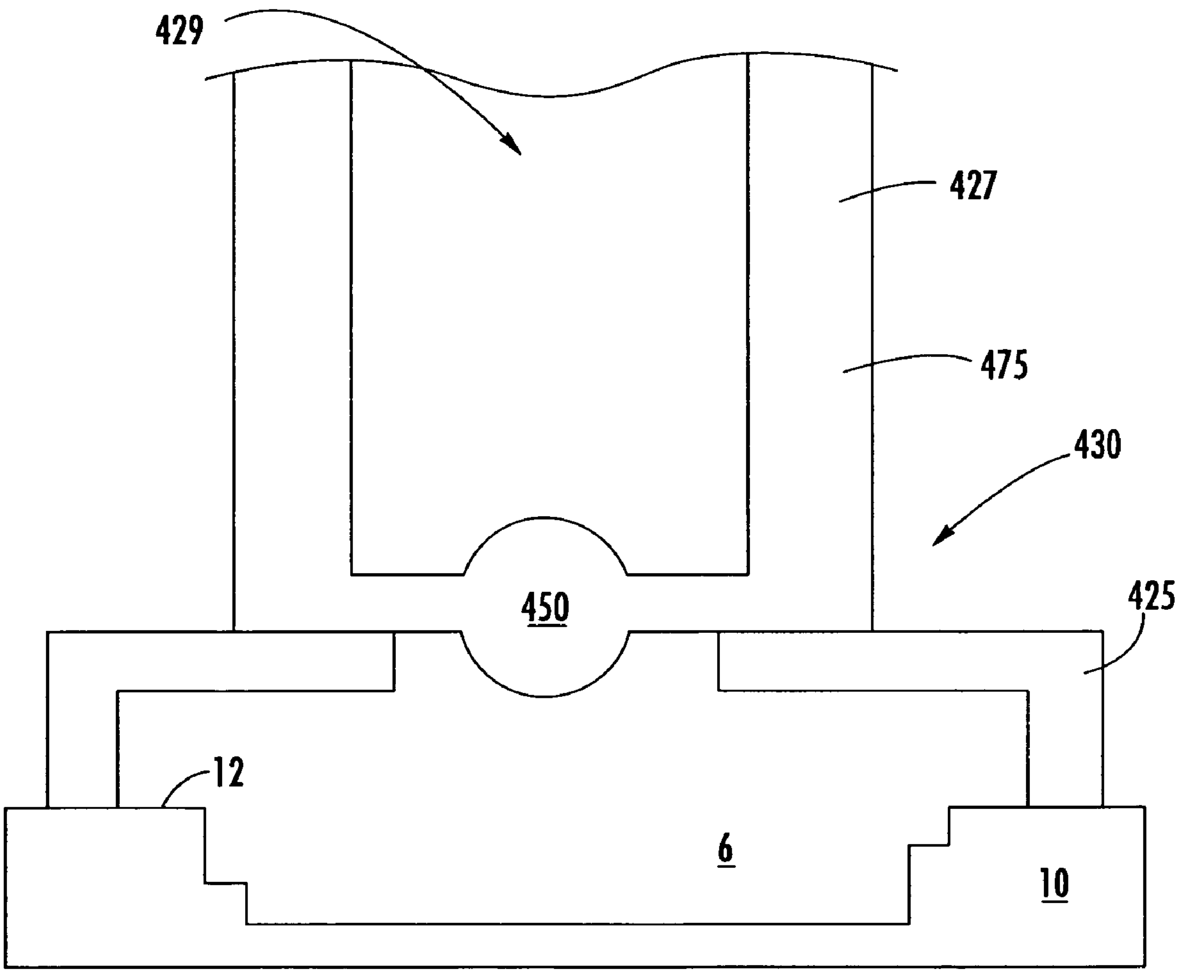
FIG. 31 is a cross-sectional view showing an exemplary OSA including a ceramic carrier coupled to a fiber receptacle by means of a bridge.

According to yet another exemplary embodiment of the present invention, the optical housing may not be a unitary optical housing such as shown in FIG. 13, but, rather, it may be formed of multiple components joined to enhance CTE (coefficient of thermal expansion) matching. FIG. 31 is a cross-sectional view of exemplary OSA 430 which includes ferrule receptacle 475 joined to multilayer ceramic carrier 10 by means of bridge 425. Multilayer ceramic carrier 10 is as described above.

Bridge 425 and ferrule receptacle 475 are separately formed, preferably of different materials, to enhance CTE matching. In an exemplary embodiment, ferrule receptacle 475 includes an integrally formed lens 450 and is formed of plastic. Plastics such as Ultem 1010, Ultem 1000, Topas 5013 or Topas 5713 may be used, but other conventional plastic materials may be used according to other exemplary embodiments. Bridge 425 is preferably formed of suitable metallic materials, but other materials may be used in alternative embodiments. Ferrule receptacle 475 is bonded to bridge 425, which is bonded to ceramic carrier 10 which may be an HTCC ceramic carrier in an exemplary embodiment. In an exemplary embodiment, bonding materials such as epoxies may be used, but other conventional bonding materials may be used alternatively.

Aperture 429 extends axially through ferrule receptacle 475 and essentially forms a hollow core of the cylindrical member. Aperture 429 formed within ferrule receptacle 475, is configured to receive an optical ferrule including an optical fiber or other optical transmission medium. OSA 430 shown in FIG. 31 may be a TOSA or ROSA. According to either exemplary embodiment, light propagated along an optical transmission medium retained axially within aperture 429 of ferrule receptacle 475 is received by or emitted from an optical component disposed within multilayer ceramic carrier 10. The arrangement shown in FIG. 31, is exemplary only, and various other configurations of ferrule receptacle 475 and bridge 425, may be used alternatively.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, the examples described herein are intended to aid the reader in understanding principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future; i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. An optical component comprising a ceramic carrier including a bottom surface and an opposed top surface being generally parallel to said bottom surface, a cavity extending down from said top surface and including interior sidewalls and a base surface, a VCSEL disposed on said base surface and capable of emitting light substantially orthogonal to said base surface, and a photodetector disposed within said cavity and capable of monitoring light emitted from said VCSEL.

2. The optical component as in claim 1, further comprising a reflective/transmissive member disposed within said cavity, angled arcuately with respect to said base surface, and which allows at least some light emitted by said VCSEL to be transmitted therethrough, said photodetector capable of sensing light emitted from said VCSEL and reflected from said reflective/transmissive member.

3. The optical component as in claim 2, wherein said reflective/transmissive member comprises glass.

4. The optical component as in claim 3, wherein at least one surface of said glass is coated with a partially-reflective coating.

5. The optical component as in claim 1, wherein said VCSEL comprises a single mode VCSEL.

6. The optical component as in claim 1, in which said photodetector is disposed on said base surface and includes a light absorbing surface which faces upward.

7. The optical component as it claim 1, in which said photodetector and said VCSEL are integrally formed within a single substrate.

8. The optical component as in claim 1, further comprising a further photodetector, each of said photodetector and said further photodetector including a light absorbing surface facing upward.

9. The optical component as in claim 1, further comprising a reflective/transmissive member covering said cavity and in which said photodetector is capable of sensing light emitted from said VCSEL and reflected from said reflective/transmissive member.

10. The optical component as in claim 9, in which said reflective/transmissive is formed of glass and hermetically seals said cavity.

11. The optical component as in claim 1, further comprising a further VCSEL disposed on said base surface, each of said VCSEL and said further VCSEL oriented to emit light along a direction generally orthogonal to said base surface, said photodetector mounted within said cavity over said further VCSEL and capable of absorbing light emitted by said further VCSEL.

12. The optical component as in claim 11, in which said photodetector is mounted on said further VCSEL.

13. The optical component as in claim 12, in which said photodetector is mounted facing said further VCSEL and using a clear epoxy.

14. The optical component as in claim 1, wherein said photodetector is affixed to a ledge formed along one of said sidewalls of said cavity and includes an absorbing surface which faces said further VCSEL.

15. The optical component as in claim 1, further comprising an integrated circuit disposed on said base surface.

16. The optical component as in claim 15, wherein said integrated circuit comprises a laser diode driver.

17. The optical component as in claim 1, in which said cavity includes terraces formed on said interior sidewalls thereof, and at least one of said photodetector and said VCSEL are wire bonded to a conductive trace formed on one of said terraces.

18. The optical component as in claim 1, in which said cavity comprises a terraced cavity and said ceramic carrier comprises a multilayer ceramic carrier formed of a plurality of stacked ceramic layers, at least two of said ceramic layers including apertures therethrough, said apertures having a different size and wherein said respective apertures are aligned over one another to form said terraced cavity, at least one of said plurality of ceramic layers including conductive traces thereon, such that said multilayer ceramic carrier therefore includes conductive traces interposed between at least a pair of adjacent stacked ceramic layers.

19. The optical component as in claim 18, in which at least one of said conductive traces extends along a terrace of said terraced cavity and terminates within said terraced cavity, and further comprising a plurality of vias extending through at least one of said plurality of ceramic layers, each via electrically coupling conductive traces formed above and below said ceramic layer through which said via extends.

20. The optical component as in claim 1, further comprising an optical housing joined to said ceramic carrier, said optical housing including a hollow cylindrical portion for retaining an optical ferule including an optical fiber therein, such that said optical fiber is positioned to propagate light emitted by said VCSEL.

21. The optical component as in claim 20, wherein said optical housing includes a lens therein.

22. The optical component as in claim 21, wherein said optical housing is formed of plastic and said lens is an integral part thereof, said plastic chosen to be transmissive to the wavelength of light emitted by said VCSEL.

23. The optical subassembly as in claim 22, wherein said lens is coated with a reflective coating such that said lens reflects some of said light emitted by said VCSEL, said photodetector capable of monitoring said reflected light.

24. The optical component as in claim 20, in which said hollow cylindrical portion is formed of plastic and said optical housing further includes a base section formed of metal and disposed between said cylindrical portion and said ceramic carrier.

* * * * *